(12) United States Patent
Kamata et al.

(10) Patent No.: US 11,985,834 B2
(45) Date of Patent: May 14, 2024

(54) SEMICONDUCTOR MEMORY DEVICE HAVING MEMORY LAYER EXTENDING BETWEEN INSULATION LAYER AND SEMICONDUCTOR LAYER

(71) Applicant: Kioxia Corporation, Tokyo (JP)

(72) Inventors: Yoshiki Kamata, Tokyo (JP); Misako Morota, Tokyo (JP); Yukihiro Nomura, Tokyo (JP); Yoshiaki Asao, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 274 days.

(21) Appl. No.: 17/346,478

(22) Filed: Jun. 14, 2021

(65) Prior Publication Data

US 2022/0093685 A1 Mar. 24, 2022

(30) Foreign Application Priority Data

Sep. 23, 2020 (JP) .................. 2020-158255

(51) Int. Cl.
*H10B 63/00* (2023.01)
*H10B 53/20* (2023.01)
*H10B 53/30* (2023.01)

(52) U.S. Cl.
CPC ........... *H10B 63/845* (2023.02); *H10B 53/20* (2023.02); *H10B 53/30* (2023.02); *H10B 63/34* (2023.02)

(58) Field of Classification Search
CPC ...... H01B 63/845; H10B 63/34; H10B 53/30; H10B 53/20
See application file for complete search history.

(56) References Cited

U.S. PATENT DOCUMENTS

| 5,894,447 A | 4/1999 | Takashima |
| 9,728,584 B2 | 8/2017 | Ramaswamy et al. |

(Continued)

FOREIGN PATENT DOCUMENTS

| JP | 2008-160004 A | 7/2008 |
| JP | 5462490 B2 | 4/2014 |

(Continued)

OTHER PUBLICATIONS

Kinoshita et al., "Scalable 3-D vertical chain-cell-type phase-change memory with $4F^2$ poly-Si diodes", 2012 Symposium on VLSI Technology Digest of Technical Papers, pp. 35-36.

(Continued)

*Primary Examiner* — Michael Jung
(74) *Attorney, Agent, or Firm* — Foley & Lardner LLP

(57) ABSTRACT

A semiconductor memory device, includes: a stack including a wiring layer and an insulation layer alternately stacked in a first direction; a semiconductor layer including a first region overlapping with the insulation layer in a second direction, and a second region overlapping with the wiring layer in the second direction; an insulation region between the wiring layer and the second region; and a memory region on the opposite side of the second region from the wiring layer. The wiring layer is farther from the first region in the second direction than the insulation layer is. The second region has a part between the insulation layers in the first direction and protruding further toward the wiring layer than the first region in the second direction. The memory region has a face opposite to the second region and closer to the wiring layer in the second direction than the first region is.

9 Claims, 28 Drawing Sheets

(56) References Cited

U.S. PATENT DOCUMENTS

| | | | |
|---|---|---|---|
| 2008/0149913 A1 | 6/2008 | Tanaka et al. | |
| 2010/0182828 A1 | 7/2010 | Shima et al. | |
| 2012/0211718 A1 | 8/2012 | Shima et al. | |
| 2013/0075684 A1 | 3/2013 | Kinoshita et al. | |
| 2013/0200331 A1* | 8/2013 | Morikawa | H10N 70/826 |
| | | | 257/5 |
| 2013/0270643 A1* | 10/2013 | Lee | H10B 43/27 |
| | | | 257/365 |
| 2016/0126292 A1* | 5/2016 | Yanagida | H10N 70/231 |
| | | | 257/4 |
| 2019/0027538 A1 | 1/2019 | Sawa et al. | |
| 2020/0194458 A1* | 6/2020 | Kim | H01L 29/42368 |

FOREIGN PATENT DOCUMENTS

| | | |
|---|---|---|
| JP | 5722180 B2 | 5/2015 |
| JP | 2018-037441 A | 3/2018 |

OTHER PUBLICATIONS

Saito et al., "Self-organized van der Waals epitaxy of layered chalcogenide structures", Phys. Status Solidi B published by Wiley-VCH Verlag Gmbh & Co. KGaA, Weinheim, 252, No. 10, 2151-2158, 2015, DOI 10.1002, pssb.201552335.

Wong et al., "Phase Change Memory", Proceedings of the IEEE, vol. 98 No. 12, Dec. 2010, pp. 2201-2227.

* cited by examiner

SEMICONDUCTOR MEMORY DEVICE HAVING MEMORY LAYER EXTENDING BETWEEN INSULATION LAYER AND SEMICONDUCTOR LAYER

CROSS-REFERENCE TO RELATED APPLICATION

This application is based upon and claims the benefit of priority from Japanese Patent Application No. 2020-158255, filed on Sep. 23, 2020; the entire contents of which are incorporated herein by reference.

FIELD

Embodiments described herein relate to a semiconductor memory device.

BACKGROUND

A semiconductor memory device uses bit lines, word lines, and memory cells connected to these lines. This device can write data in and read data from the memory cell by selecting the bit line and the word line to apply a voltage.

DETAILED DESCRIPTION

Figure 1:
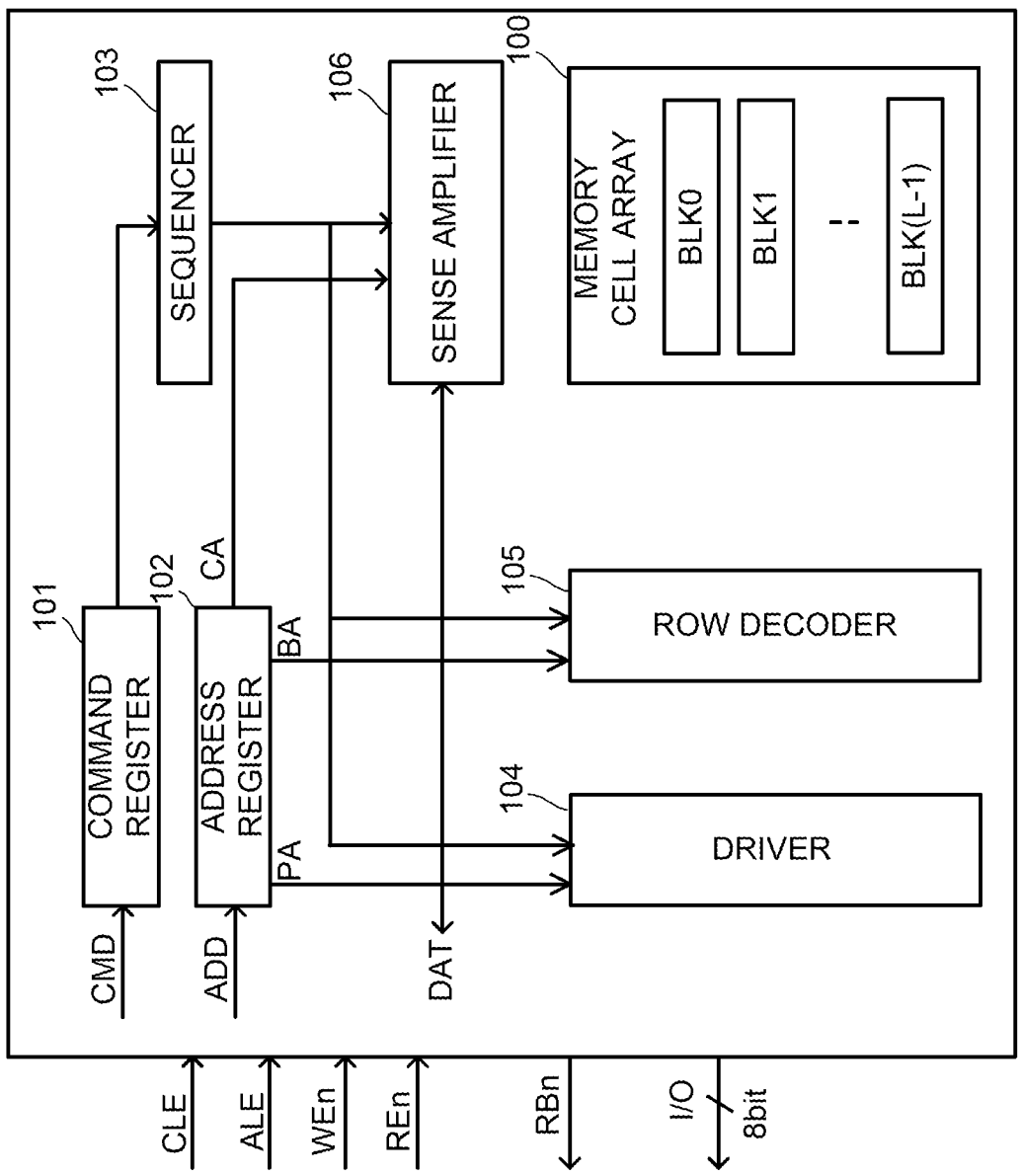
FIG. 1 is a block diagram illustrating a configuration example of a memory.

A semiconductor memory device, includes: a stack including a wiring layer and an insulation layer, the wiring layer and the insulation layer being alternately stacked in a first direction; a semiconductor layer including a first region and a second region, the first region overlapping with the insulation layer in a second direction intersecting the first direction, and the second region overlapping with the wiring layer in the second direction; an insulation region provided between the wiring layer and the second region; and a memory region provided on the opposite side of the second region from the wiring layer. The wiring layer is farther from the first region in the second direction than the insulation layer is. The second region has a part provided between a plurality of the insulation layers in the first direction and protruding further toward the wiring layer than the first region in the second direction. The memory region has a face opposite to the second region, the face being closer to the wiring layer in the second direction than the first region is.

Embodiments will be hereinafter described with reference to the drawings. In the drawings, the relation of thickness and planer dimension of each constituent element, a thickness ratio among the configurations, and so on may be different from actual ones. Further, in the embodiments, substantially the same configurations are denoted by the same reference signs, and a description thereof will be appropriately omitted.

In the present description, the word "connection" may mean not only physical connection but also electrical connection, unless otherwise specified.

A configuration example of a semiconductor memory device of the present embodiment will be described. FIG. 1 is a block diagram illustrating a configuration example of a memory. The memory includes a memory cell array 100, a command register 101, an address register 102, a sequencer 103, a driver 104, a row decoder 105, and a sense amplifier 106.

The memory cell array 100 includes a plurality of blocks BLK (BLK0 to BLK(L-1)), where L denotes a natural number of 2 or more. The blocks BLK are each a set of memory cells that store data.

The command register 101 holds a command signal CMD received from a memory controller. The command signal CMD includes, for example, command data causing the sequencer 103 to execute a read operation, a write operation, and an erase operation.

The address register 102 holds an address signal ADD received from the memory controller. The address signal ADD includes, for example, a block address BA, a page address PA, and a column address CA. For example, the block address BA, the page address PA, and the column address CA are used for selecting a block BLK, a word line WL, and a bit line BL, respectively.

The sequencer 103 controls the operation of the memory. For example, the sequencer 103 controls the circuit such as the driver 104, the row decoder 105, or the sense amplifier 106 in accordance with the command signal CMD held in the command register 101 to execute the operation such as the read operation, the write operation, and the erase operation.

The driver 104 generates voltages for the read operation, the write operation, and the erase operation. The driver 104 includes, for example, a DA converter. Further, the driver 104 applies the generated voltage to a signal line corresponding to the word line WL selected based on the page address PA held in the address register 102, for example.

Based on the block address BA held in the address register 102, the row decoder 105 selects a corresponding one block BLK in the memory cell array 100. Subsequently, for example, the row decoder 105 transfers the voltage applied to the signal line corresponding to the selected word line WL to the selected word line WL in the selected block BLK.

In the write operation, the sense amplifier 106 applies a desired voltage to each bit line BL according to write data DAT received from the memory controller. Further, in the read operation, the sense amplifier 106 determines data stored in the memory cell based on the voltage of the bit line BL and transfers the determination result as read data DAT to the memory controller.

The communication between the memory and the memory controller supports the NAND interface protocol, for instance. For example, the communication between the memory and the memory controller uses a command latch enable signal CLE, an address latch enable signal ALE, a write enable signal WEn, a read enable signal REn, a ready/busy signal RBn, and an input/output signal I/O.

The command latch enable signal CLE indicates that an input/output signal I/O received by the memory is a command signal CMD. The address latch enable signal ALE indicates that a received signal I/O is an address signal ADD. The write enable signal WEn is a signal that commands the memory to receive an input/output signal I/O. The read enable signal REn is a signal that commands the memory to output an input/output signal I/O.

The ready/busy signal RBn is a signal that notifies the memory controller whether the memory is in a ready state in which it accepts a command from the memory controller or is in a busy state in which it does not accept a command.

The input/output signal I/O is a signal with, for example, an eight-bit width, and may include signals such as the command signal CMD, the address signal ADD, and the write data signal DAT.

A combination of the memory and the memory controller described above may form one semiconductor memory device. Examples of such a semiconductor memory device include a memory card such as an SD card and a solid state drive (SSD).

Figure 2:
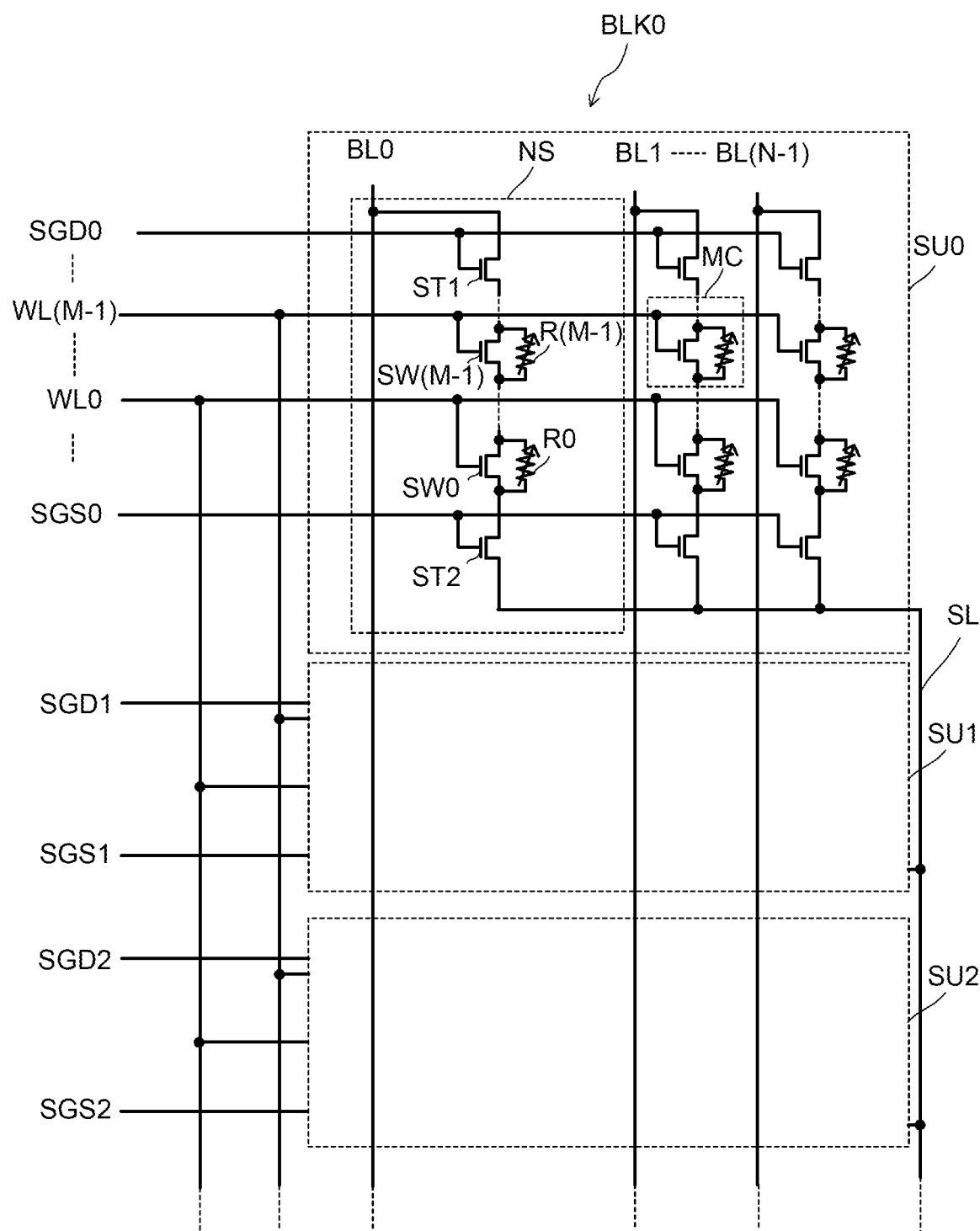
FIG. 2 is a circuit diagram illustrating a circuit configuration of a memory cell array 100.

Next, a circuit configuration example of the memory cell array 100 will be described. FIG. 2 is a circuit diagram illustrating the circuit configuration of the memory cell array 100. FIG. 2 illustrates the block BLK0 as an example, and the configuration of the other blocks BLK is also the same.

The block BLK includes a plurality of string units SU. The string units SU each include a plurality of NAND strings NS. FIG. 2 illustrates the three string units SU (SU0 to SU2), but the number of the string units SU is not limited.

The NAND strings NS are each connected to one of bit lines BL (BL0 to BL(N−1)), where N denotes a natural number of 2 or more. The NAND strings NS each include switch transistors SW, variable resistors R, a select transistor ST1, and a select transistor ST2. The switch transistor SW and the variable resistor R form one memory cell MC. Each of the NAND strings NS has a plurality of memory cells connected in series. The memory including such memory cells is also referred to as a chain-type memory.

A gate of the switch transistor SW is connected to a corresponding word line WL. One of a source and a drain of one of the switch transistors SW is connected to the other of a source and a drain of another switch transistor SW out of the switch transistors SW. FIG. 2 illustrates the switch transistors SW (SW0 to SW(M−1)), where M denotes a natural number of 2 or more, but the number of the switch transistors SW is not limited.

The variable resistor R is connected in parallel with the switch transistor SW. The variable resistor R has a memory layer (memory region) of, for example, a phase-change memory (PCM), an interfacial phase-change memory (iPCM), a resistance-change memory (ReRAM), a conductive bridge memory (CBRAM), or a ferroelectric memory (FeRAM). An electric resistance or an electric capacitance of these memory layers changes due to application of voltage exceeding a threshold voltage. FIG. 2 illustrates a plurality of variable resistors R (R0 to R(M−1)), where M denotes a natural number of 2 or more, but the number of the variable resistors R is not limited.

Control of the switch transistor SW connected to the selected word line WL turn into an off-state, enables to apply a voltage to the variable resistor R to change an electric resistance or an electric capacitance. This can store data into the memory cell.

The select transistor ST1 is used for selecting a string unit SU in the various operations. The number of the select transistors ST1 is not limited.

The select transistor ST2 is used for selecting a string unit SU in the various operations. The number of the select transistors ST2 is not limited.

In each of the NAND strings NS, a drain of the select transistor ST1 is connected to a corresponding bit line BL. A source of the select transistor ST1 is connected to one end of the serially-connected switch transistors SW. The other end of the serially-connected switch transistors SW is connected to a drain of the select transistor ST2.

In the same block BLK, the sources of the select transistors ST2 are connected to a source line SL. Gates of the select transistors ST1 of the respective string units SU are connected to corresponding select gate lines SGD, respectively. Gates of the switch transistors SW are connected to corresponding word lines WL, respectively. Gates of the select transistors ST2 are connected to corresponding select gate lines SGS, respectively.

In the blocks BLK, the NAND strings NS to which the same column address CA is assigned are connected to the same bit line BL. The source line SL is connected between the blocks BLK.

Next, a structure example of the NAND string NS will be described. The structure example of the NAND string NS includes a structure of any of a first structure example to a fourth structure example, for example. Each structure example will be described below.

First Structure Example

Figure 3:
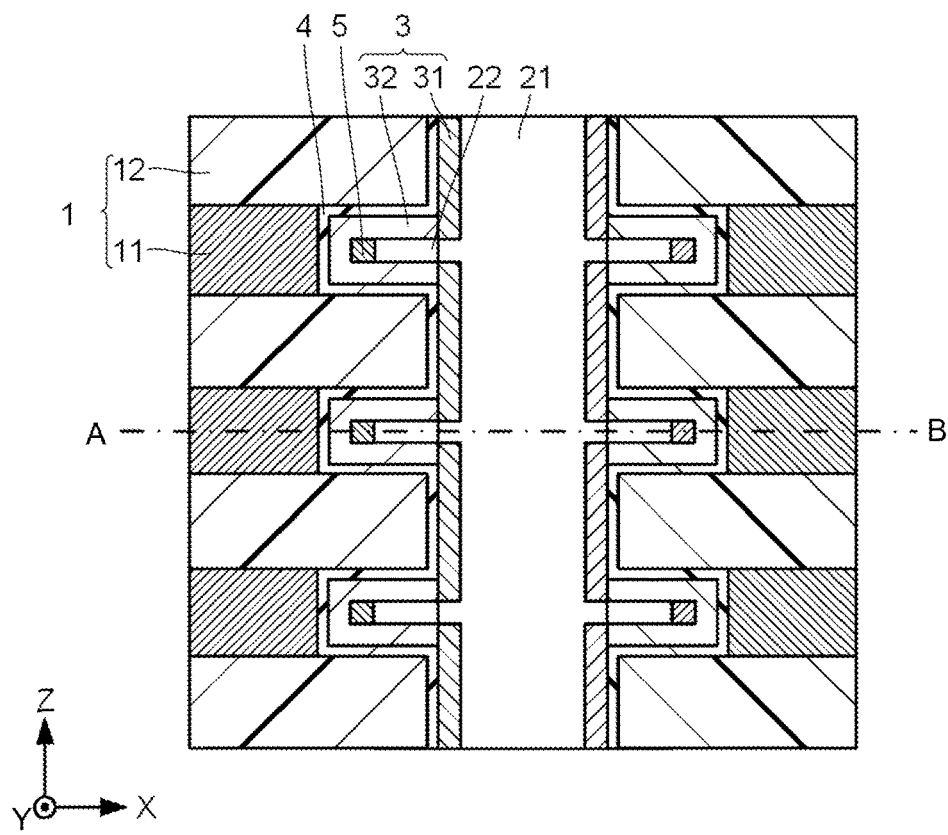
FIG. 3 is a schematic sectional view for explaining a first structure example of a NAND string NS.
Figure 4:
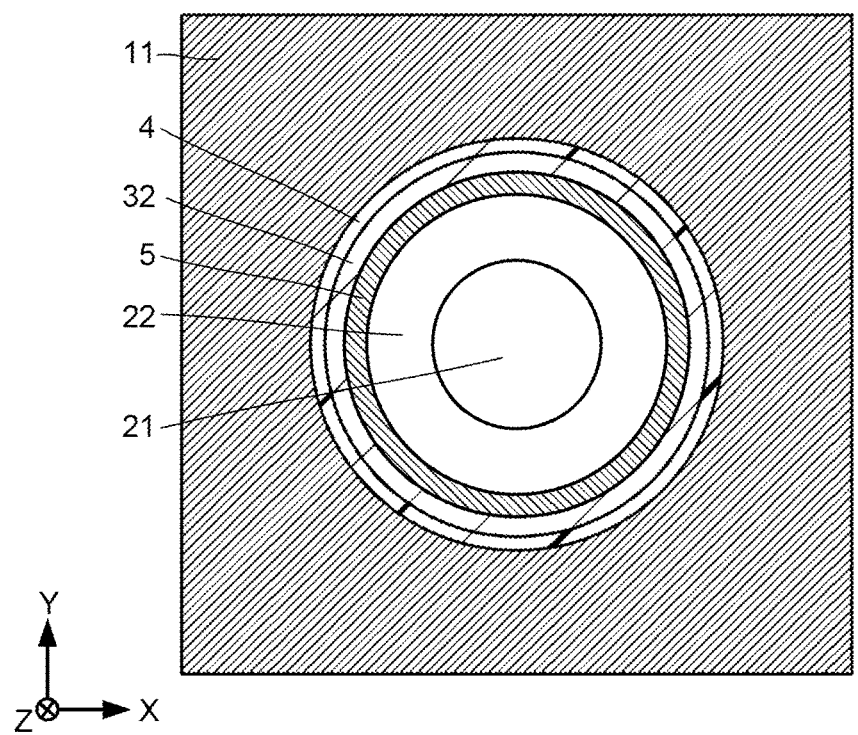
FIG. 4 is a schematic sectional view along a line A-B in FIG. 3.

FIG. 3 is a schematic sectional view for explaining the first structure example of the NAND string NS, in which an X axis, a Y axis orthogonal to the X axis, and a Z axis orthogonal to the X axis and the Y axis are illustrated, and a part of X-Z cross section including the X axis and the Z axis is illustrated. FIG. 4 is a schematic sectional view along a line A-B in FIG. 3, and illustrates a part of X-Y cross section including the X axis and the Y axis.

As illustrated in FIG. 3 and FIG. 4, the NAND string NS includes a stack 1, an insulation layer 21, an insulation layer 22, a semiconductor layer 3, an insulation layer 4, and a memory layer 5.

The stack 1 includes a wiring layer 11 and an insulation layer 12. Each of a plurality of the wiring layers 11 and each of a plurality of the insulation layers 12 are alternately stacked along the Z axis direction. The wiring layer 11 forms a word line WL and a gate electrode of the switch transistor SW, and extends along the X axis direction. Examples of the wiring layer 11 include a conductive layer such a tungsten layer. Examples of the insulation layer 12 include a silicon oxide layer.

The insulation layer 21 is provided along a direction (Z axis direction) in which the wiring layer 11 and the insulation layer 12 are stacked, for example. The insulation layer 21 can function as a core insulator. The insulation layer 21 has a columnar shape, for example. Examples of the insulation layer 21 include a silicon oxide layer.

The insulation layer 22 is provided between the insulation layer 21 and the memory layer 5. Examples of the insulation layer 22 include a silicon oxide layer.

As illustrated in FIG. 4, the semiconductor layer 3 surrounds the insulation layer 21 and the insulation layer 22 in the X-Y cross section. The semiconductor layer 3 includes a region 31 which is provided between the insulation layer 12 and the insulation layer 21 and overlapping with the insulation layer 12 in the X axis direction, and a region 32 which is provided between the wiring layer 11 and the insulation layer 21 and overlapping with the wiring layer 11 in the X axis direction. The region 31 and the region 32 are continued to each other. A plurality of the regions 31 is physically separated by a plurality of the regions 32.

The region 31 and the region 32 contain polysilicon, for example. An electric resistivity of the region 31 is preferably lower than an electric resistivity of the region 32. In order to reduce the electric resistivity of the region 31, the region 31 may also contain silicide. Examples of silicide include tungsten silicide, molybdenum silicide, tantalum silicide, titanium silicide, cobalt silicide, nickel silicide, and platinum silicide. Further, the region 31 may also contain silicon in which an impurity such as phosphorus is doped. The region 31 illustrated in FIG. 3 contains nickel silicide, as an example.

The region 31 forms a source region or a drain region of the switch transistor SW. The region 32 forms a channel region of the switch transistor SW.

The wiring layer 11 is farther from the region 31 in the X axis direction than the insulation layer 12 is. The region 32 has a part (protrusion) provided between the insulation layers 12 in the Z axis direction and protruding further toward the wiring layer 11 than the region 31 in the X axis direction.

The insulation layer (insulation region) 4 is provided between the wiring layer 11 and the region 32 and between the insulation layer 12 and the region 31 in the X axis direction. The insulation layer 4 forms a gate insulation layer of the switch transistor SW. Examples of the insulation layer 4 include a silicon oxide layer.

The memory layer 5 is provided on the opposite side of the region 32 from the wiring layer 11. The memory layer 5 is provided between the insulation layer 21 and the region 32 in the X axis direction. The memory layer 5 forms the variable resistor R. The memory layer 5 includes, for example, a resistance-change layer or a capacitance-change layer. Examples of the resistance-change layer include resistance-change layers of a phase-change memory (PCM), an interfacial phase-change memory (iPCM), a resistance-change memory (ReRAM), and a conductive bridge memory (CBRAM). Examples of the capacitance-change layer include a capacitance-change layer of a ferroelectric memory (FeRAM). Here, explanation will be made on a case where a resistance-change layer containing a Ge—Sb—Te-based chalcogenide compound is used, as an example.

A face on the opposite side of the memory layer 5 from the region 32 is closer to the wiring layer 11 in the X axis direction than the region 31 is. This indicates that the memory layer 5 is divided for each region 32. The memory layer 5 is provided between the region 32 and the insulation layer 22 in the X axis direction, and is surrounded by the region 32 in the X-Y cross section. Further, the insulation layer 22 is surrounded by the region 32 in the X-Y cross section.

Next, an example of a method of manufacturing the NAND string NS illustrated in FIG. 3 will be described. FIG. 5 to FIG. 16 are schematic sectional views for explaining the example of the method of manufacturing the NAND string NS illustrated in FIG. 3, and each of which illustrates a part of X-Z cross section.

Figure 5:
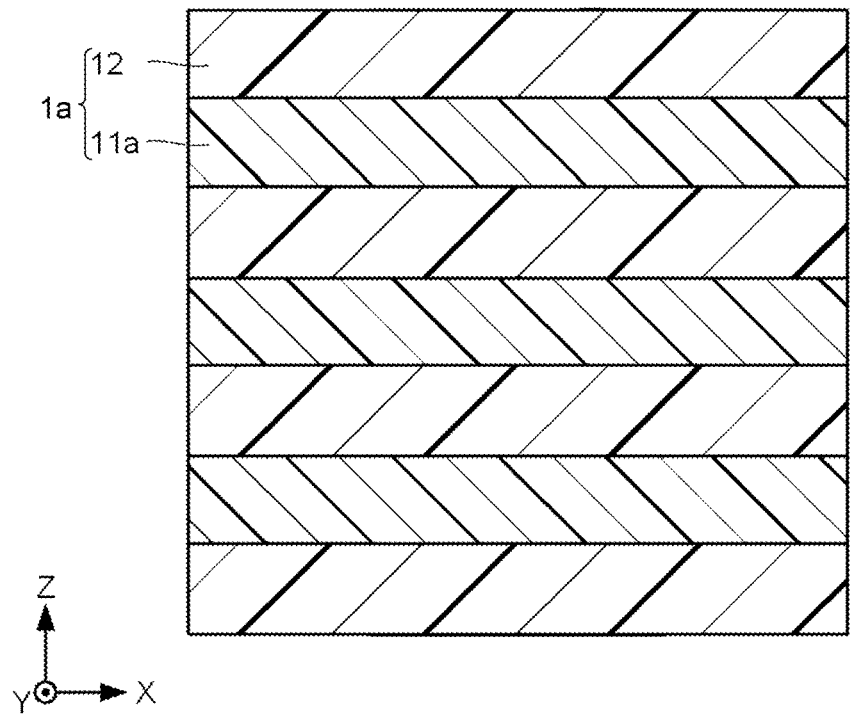
FIG. 5 is a schematic sectional view for explaining an example of a method of manufacturing the NAND string NS illustrated in FIG. 3.

First, as illustrated in FIG. 5, an insulation layer 11a and the insulation layer 12 are alternately stacked along the Z axis direction to form a stack 1a. The insulation layer 11a is a sacrificial layer. The sacrificial layer is a layer used for forming a cavity later. Examples of the insulation layer 11a include a silicon nitride layer.

Figure 6:
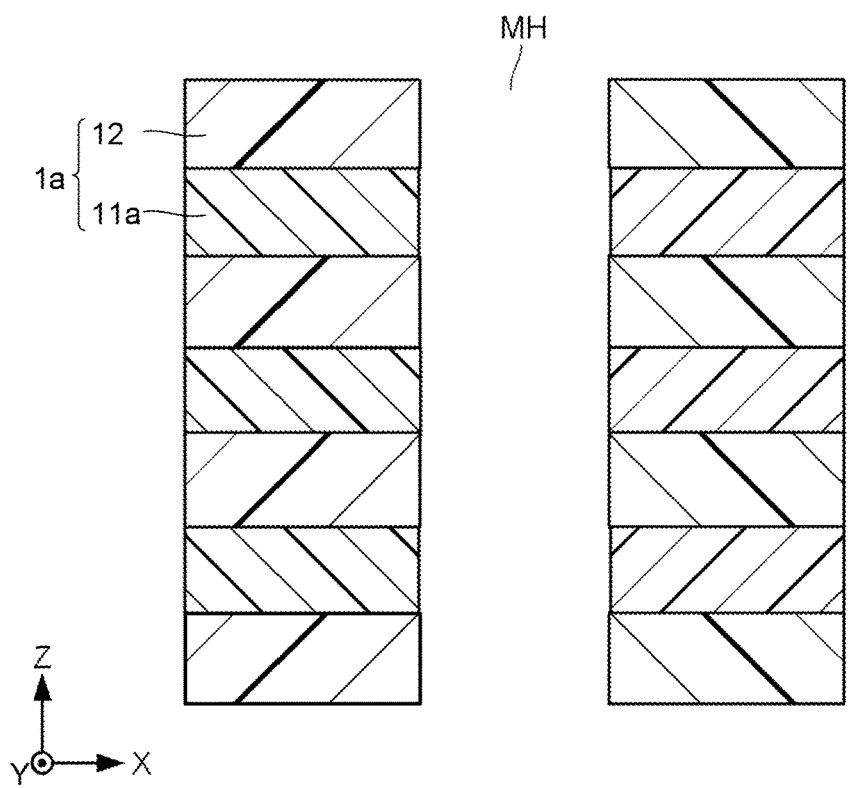
FIG. 6 is a schematic sectional view for explaining the example of the method of manufacturing the NAND string NS illustrated in FIG. 3.

Next, as illustrated in FIG. 6, the stack 1a is processed to form a memory hole MH penetrating with the stack 1a along the Z axis direction. The stack 1a is processed by reactive ion etching (RIE), for example.

Figure 7:
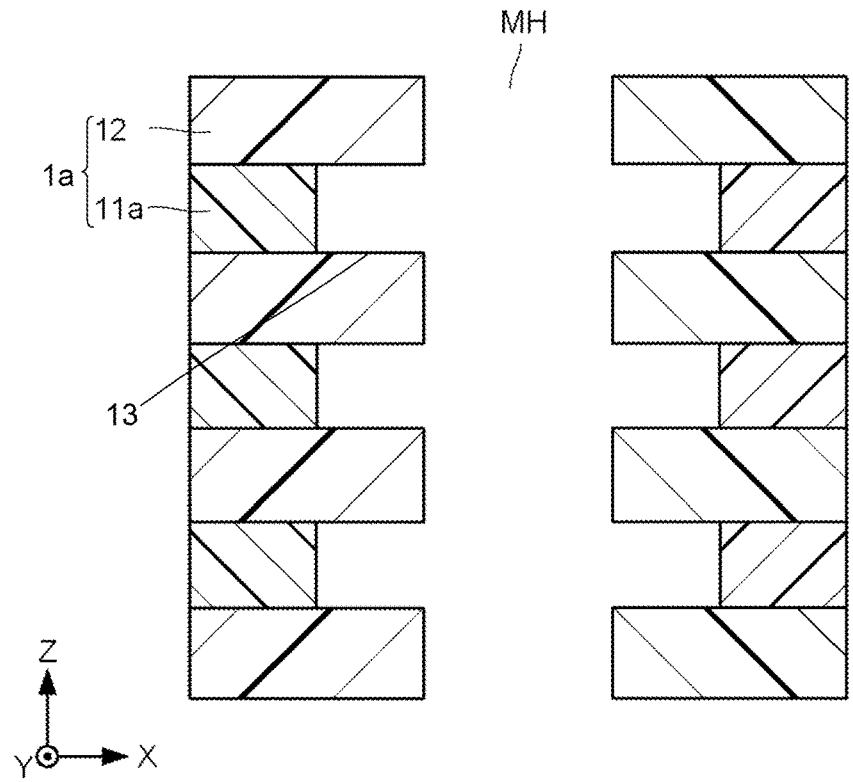
FIG. 7 is a schematic sectional view for explaining the example of the method of manufacturing the NAND string NS illustrated in FIG. 3.

Next, as illustrated in FIG. 7, the insulation layer 11a is partially removed along the X-Y cross section, and thus an inner groove 13 is formed in the stack 1a. The inner groove 13 is provided between one of the insulation layers 12 and another one of the insulation layers 12 in the Z axis direction, and overlaps with the wiring layer 11 to be formed later in the X axis direction. The inner groove 13 is formed by processing an inner peripheral surface of the insulation layer 11a so as to recess further toward the outside than an inner peripheral surface of the insulation layer 12. The insulation layer 11a is partially removed by dry etching, for example.

Figure 8:
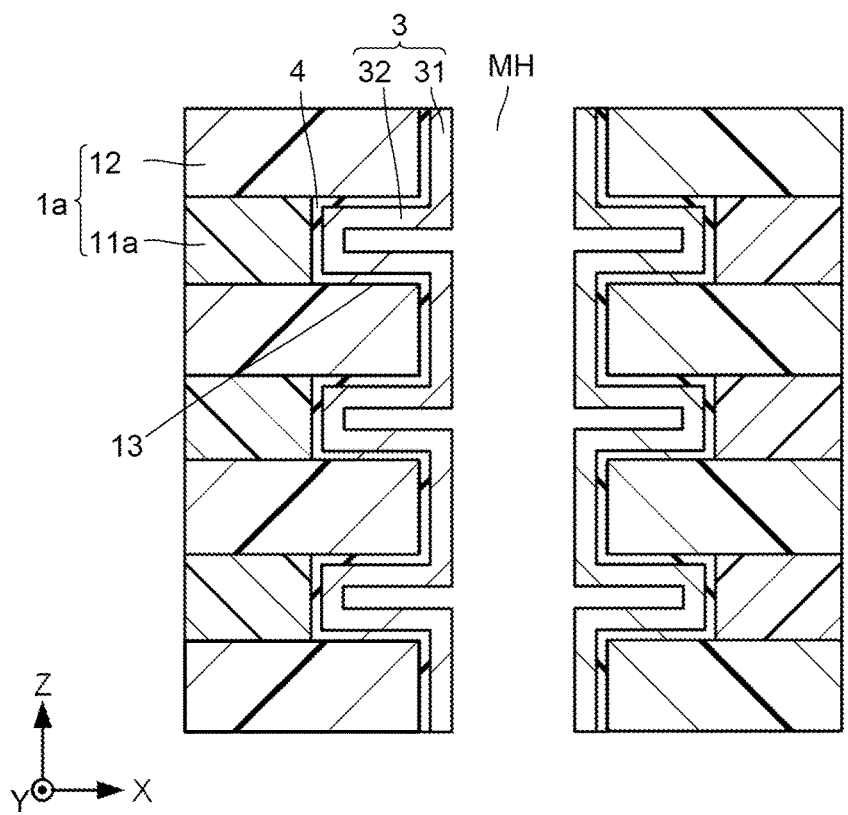
FIG. 8 is a schematic sectional view for explaining the example of the method of manufacturing the NAND string NS illustrated in FIG. 3.

Next, as illustrated in FIG. 8, the insulation layer 4 is formed on a surface facing the memory hole MH of the insulation layer 11a and a surface facing the memory hole MH of the insulation layer 12, and the semiconductor layer 3 is formed on a surface of the insulation layer 4. The semiconductor layer 3 and the insulation layer 4 can be formed by, for example, a chemical vapor deposition (CVD) method or an atomic layer deposition (ALD) method.

Figure 9:
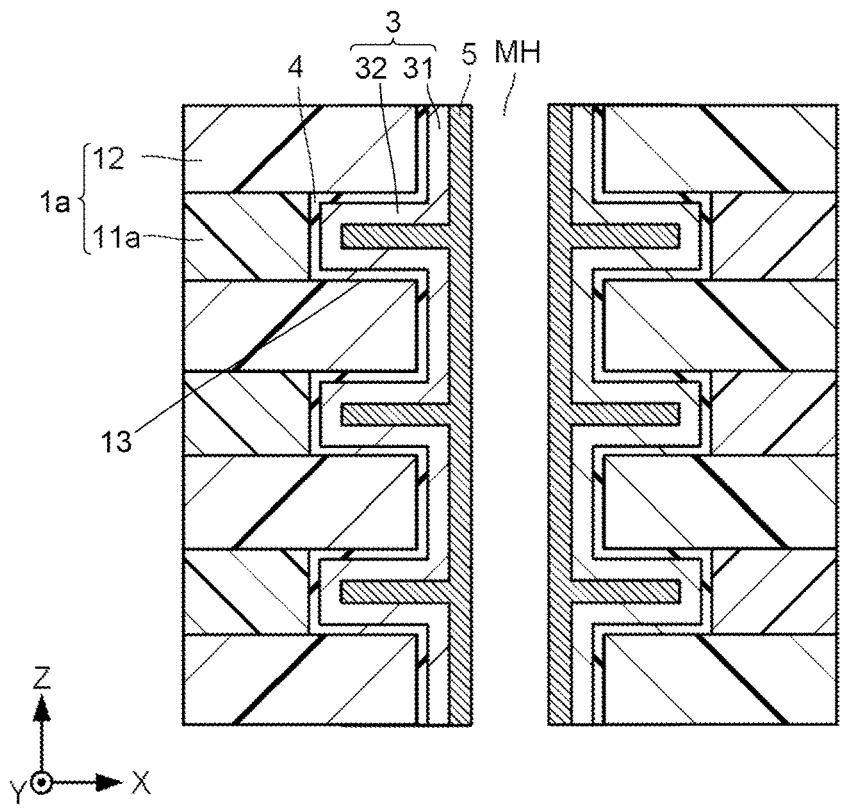
FIG. 9 is a schematic sectional view for explaining the example of the method of manufacturing the NAND string NS illustrated in FIG. 3.

Next, as illustrated in FIG. 9, the memory layer 5 is formed on a surface of the semiconductor layer 3. The memory layer 5 can be formed by the ALD method, for example.

Figure 10:
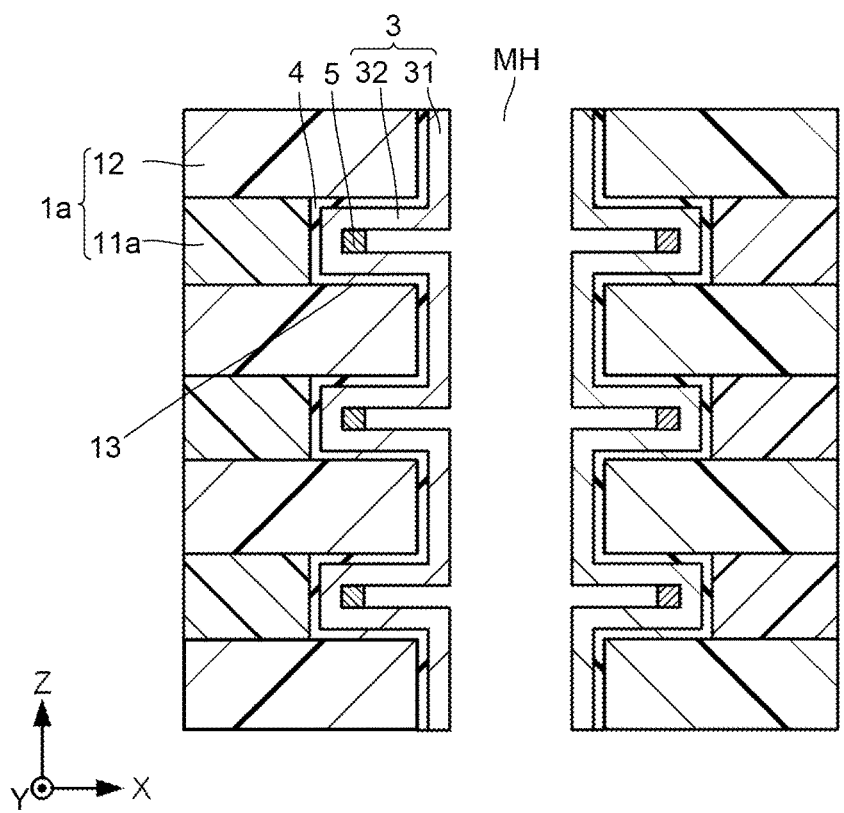
FIG. 10 is a schematic sectional view for explaining the example of the method of manufacturing the NAND string NS illustrated in FIG. 3.

Next, as illustrated in FIG. 10, the memory layer 5 is partially removed along the X axis direction, to divide the memory layer 5. The memory layer 5 can be partially removed by dry etching or wet etching, for example.

Figure 11:
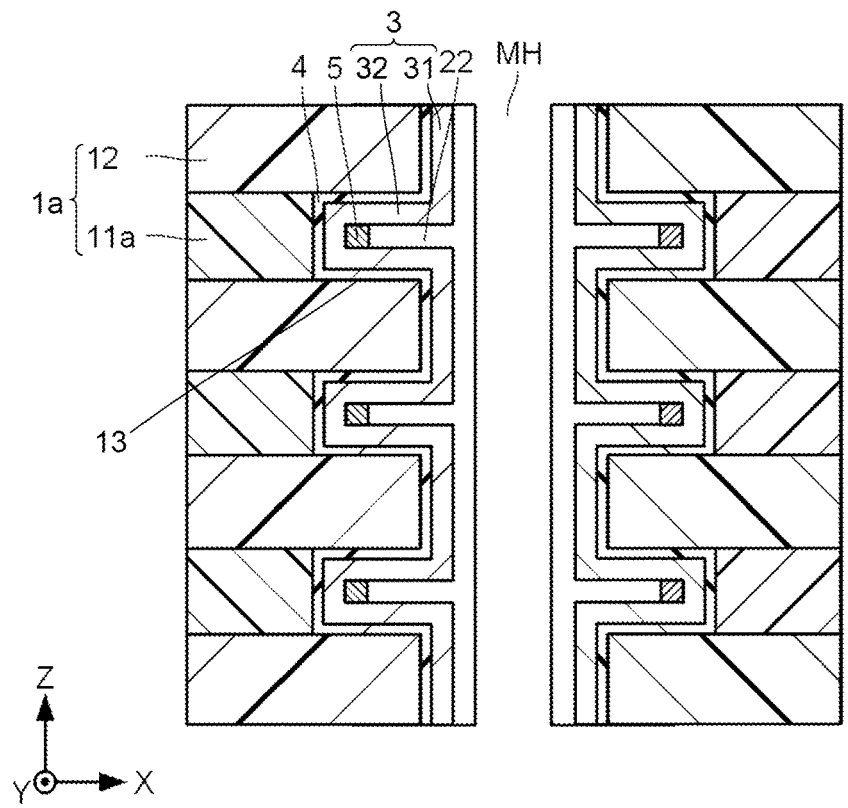
FIG. 11 is a schematic sectional view for explaining the example of the method of manufacturing the NAND string NS illustrated in FIG. 3.

Next, as illustrated in FIG. 11, the insulation layer 22 is formed on a surface of the memory layer 5 in the inside of the inner groove 13. The insulation layer 22 can be formed by the CVD method or the ALD method, for example.

Figure 12:
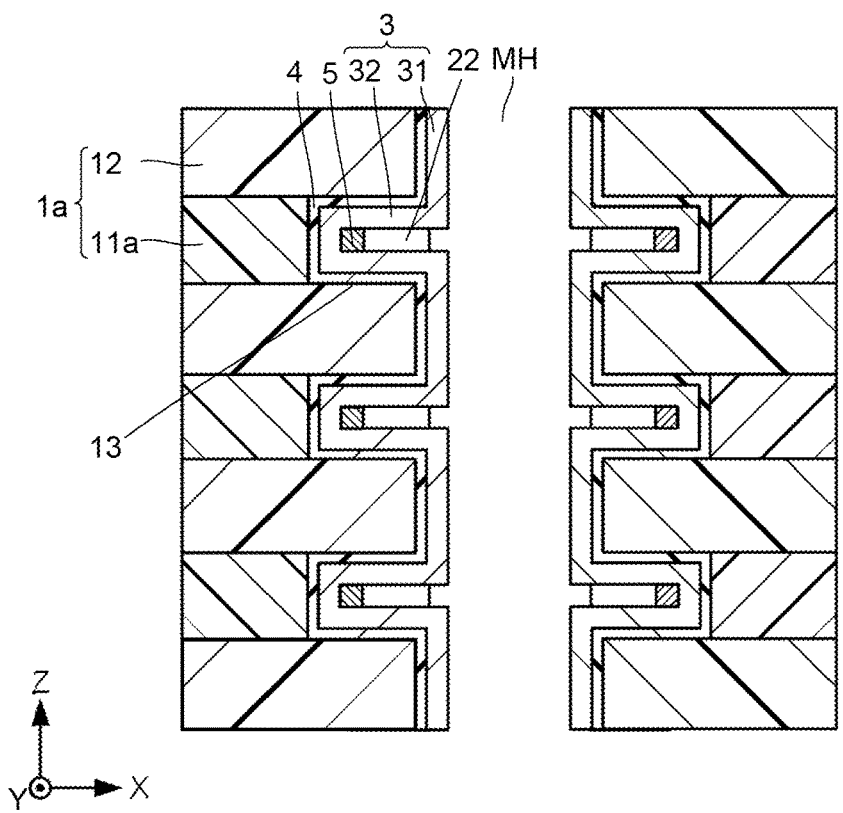
FIG. 12 is a schematic sectional view for explaining the example of the method of manufacturing the NAND string NS illustrated in FIG. 3.

Next, as illustrated in FIG. 12, the insulation layer 22 is partially removed along the X-Y cross section, and thus the insulation layer 22 is divided. The insulation layer 22 can be partially removed by the dry etching, for example.

Figure 13:
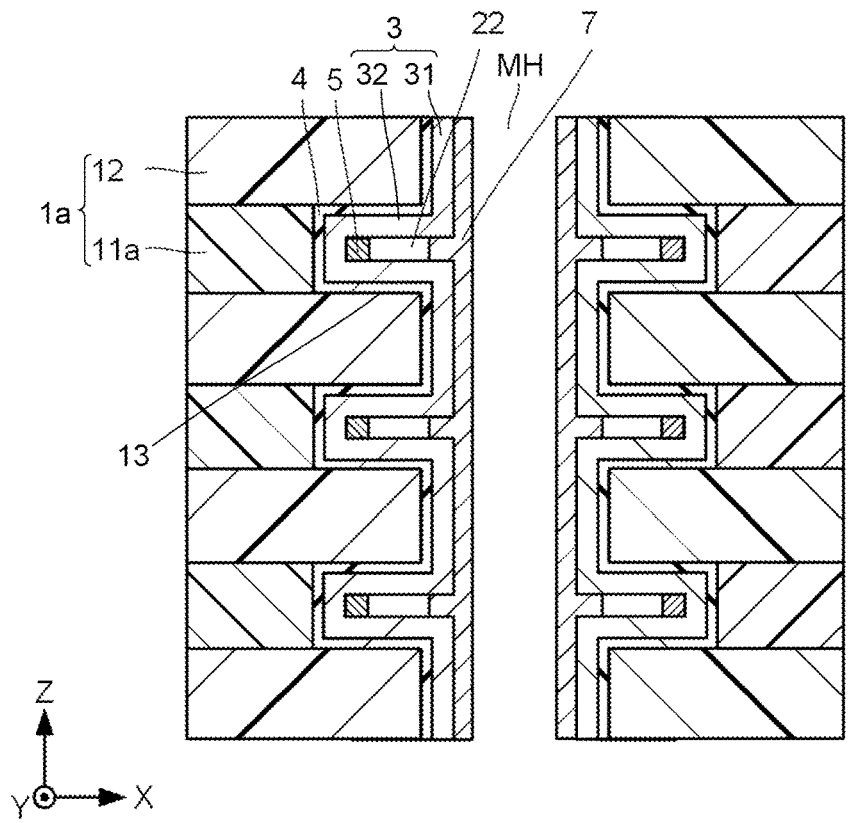
FIG. 13 is a schematic sectional view for explaining the example of the method of manufacturing the NAND string NS illustrated in FIG. 3.

Next, as illustrated in FIG. 13, a metal layer 7 is formed on a surface of the region 31 of the semiconductor layer 3. The metal layer 7 contains a metal element such as tungsten, molybdenum, tantalum, titanium, cobalt, nickel, or platinum. The metal layer 7 is formed by the CVD method or the ALD method, for example.

Figure 14:
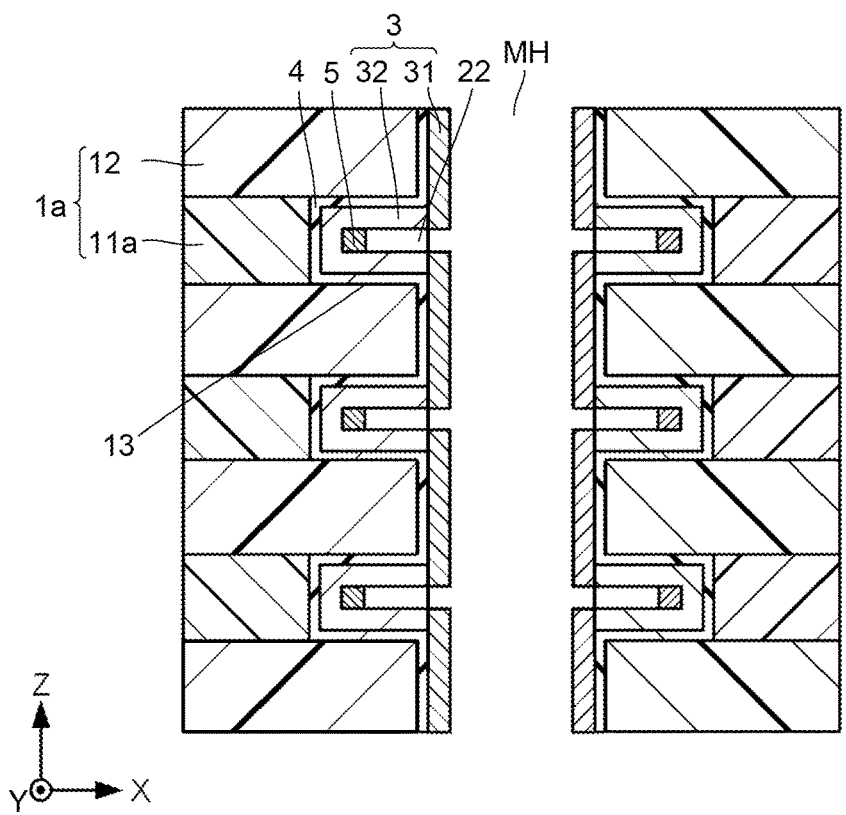
FIG. 14 is a schematic sectional view for explaining the example of the method of manufacturing the NAND string NS illustrated in FIG. 3.

Next, as illustrated in FIG. 14, silicide is formed in the region 31 of the semiconductor layer 3 by a salicide method. The metal layer 7 is removed by the dry etching or the wet etching after forming the silicide.

Figure 15:
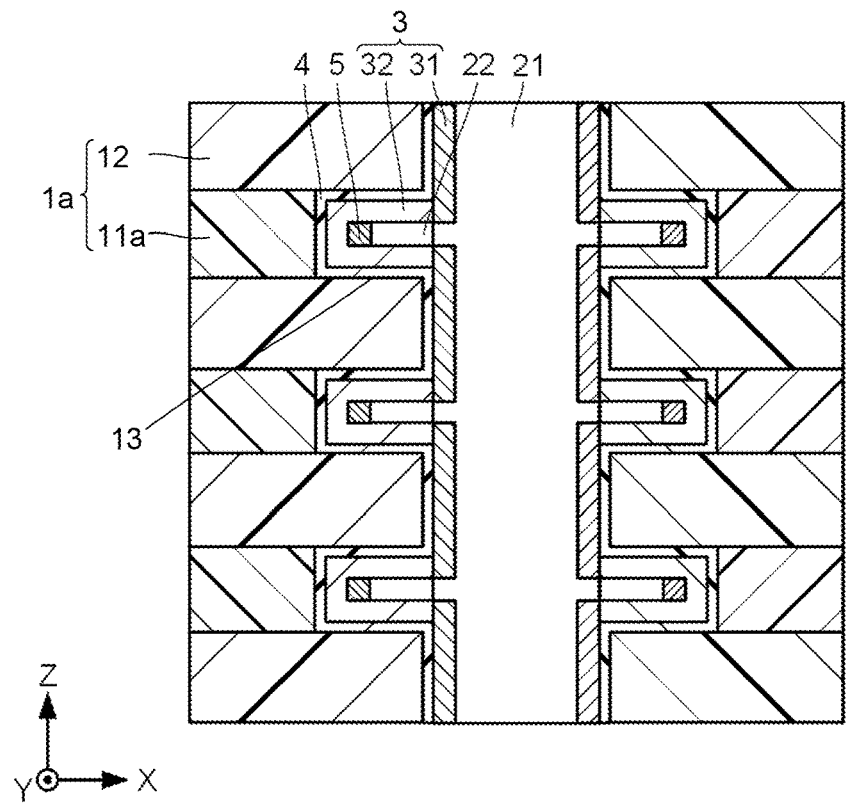
FIG. 15 is a schematic sectional view for explaining the example of the method of manufacturing the NAND string NS illustrated in FIG. 3.

Next, as illustrated in FIG. 15, the insulation layer 21 filling the memory hole MR is formed. The insulation layer 21 can be formed by the CVD method or the ALD method, for example.

Figure 16:
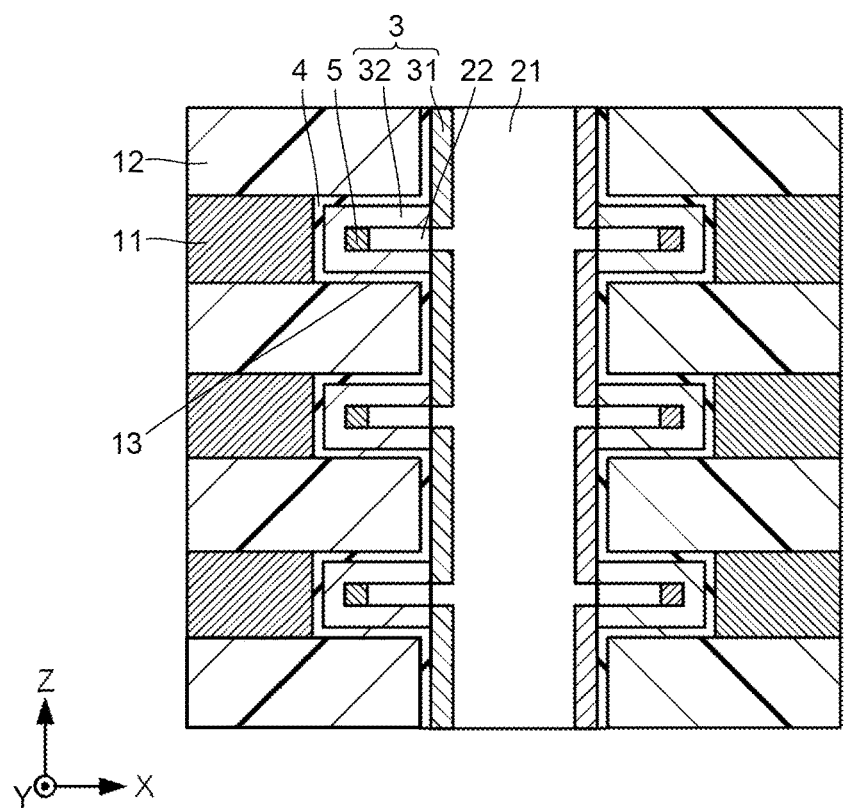
FIG. 16 is a schematic sectional view for explaining the example of the method of manufacturing the NAND string NS illustrated in FIG. 3.

Next, the insulation layer 11a is removed to form a cavity, and as illustrated in FIG. 16, the wiring layer 11 is formed in the cavity. The above-described process can form memory cells including the switch transistors SW and the variable resistors R.

The first structure example has the protrusion on the region 32 of the semiconductor layer 3 to form a protruding channel region on the switch transistor SW. This extends an effective distance between memory cells to reduce heat conduction between adjacent memory cells, resulting in preventing malfunctions such as erroneous writing.

Figure 17:
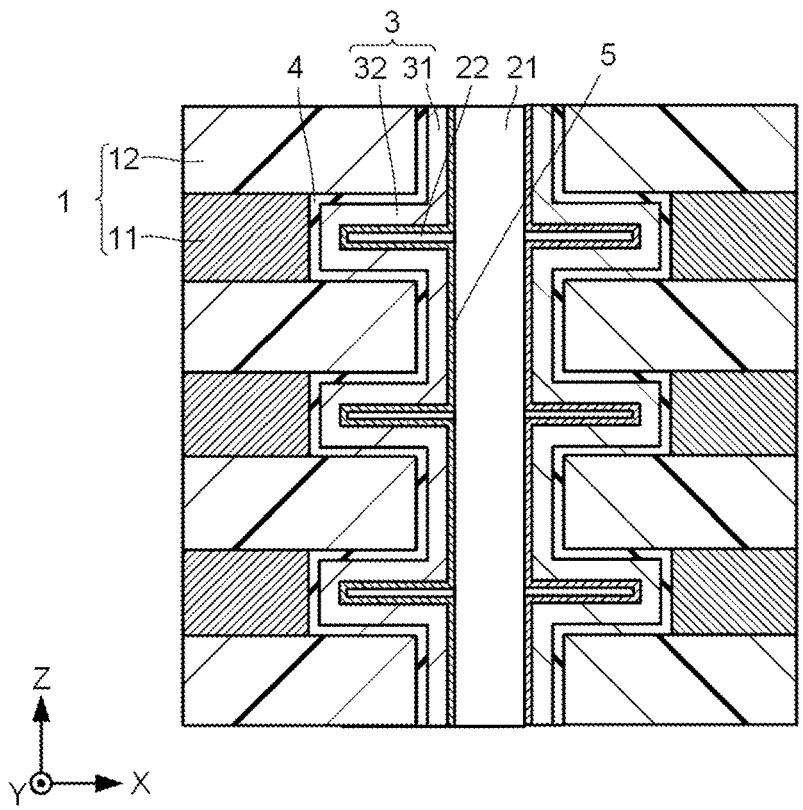
FIG. 17 is a schematic sectional view illustrating another structure example of the memory cell.
Figure 18:
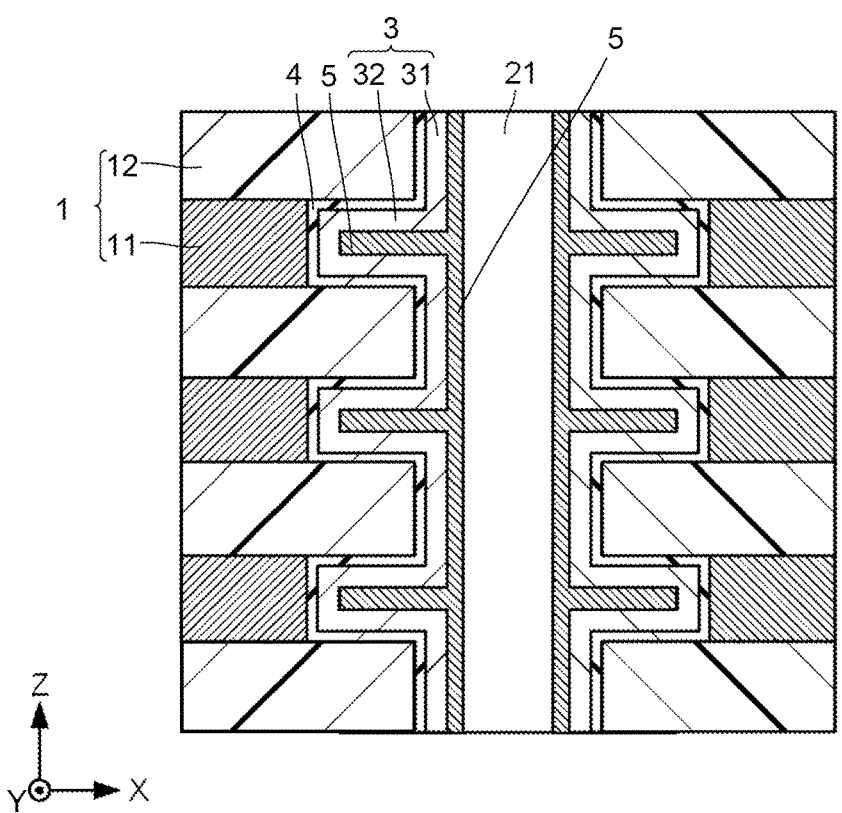
FIG. 18 is a schematic sectional view illustrating another structure example of the memory cell.

The structure of the memory cell for increasing the effective distance between memory cells is not limited to the structure illustrated in FIG. 3. Each of FIG. 17 and FIG. 18 is a schematic sectional view illustrating another structure example of the memory cell, and illustrates the X-Z cross section. Explanation of parts same as those of FIG. 3 will be omitted in this structure example.

Each of FIG. 17 and FIG. 18 illustrates the memory layer 5 that continuously extends between the region 31 and the insulation layer 21 and between the region 32 and the insulation layer 21. As illustrated in FIG. 17, the insulation layer 22, which overlaps with the memory layer 5 in the X axis direction and is surrounded by the memory layer 5 in the X-Y cross section, is formed as a core material of the protrusion of the region 32, resulting in easily retain heat at the protrusion. Consequently, this structure prevents the heat conduction between adjacent memory cells. The structure is not limited to this structure. As illustrated in FIG. 18, a face on the opposite side of the memory layer 5 from the region 32 may be provided to be flush with a face on the opposite side of the memory layer 5 from the region 31 or to be farther from the wiring layer 11 than the opposite face.

Further, in the first structure example, the formation of the silicide in the regions 31 achieves the electric resistivity of the region 31 smaller than the electric resistivity of the region 32. This enables physically separating the regions 32 by the regions 31 to use the regions 31 to form n-channel type transistors and p-channel type transistors, for example.

Figure 19:
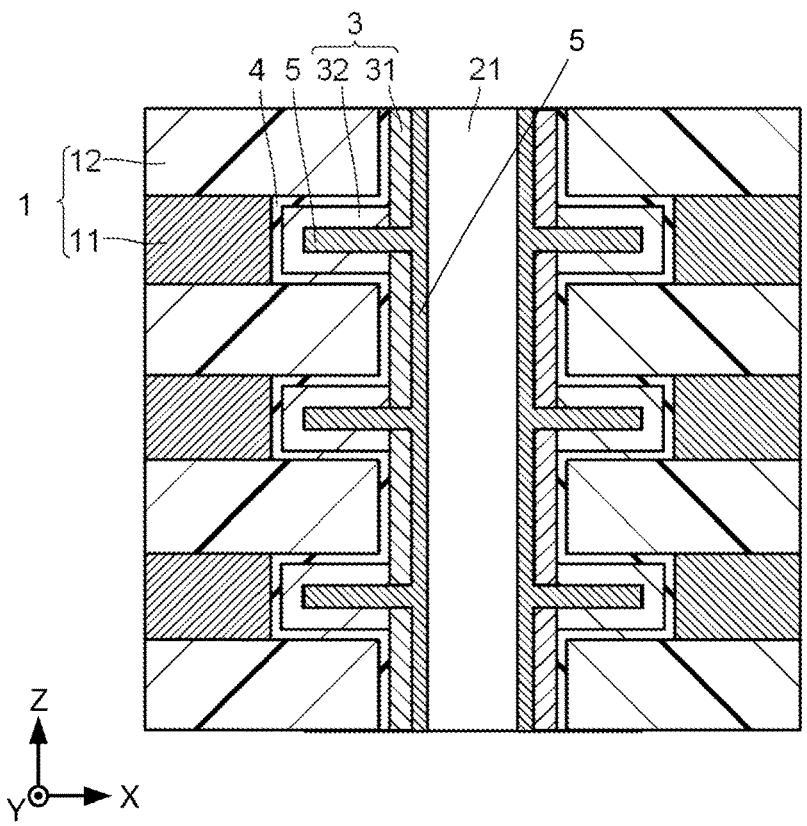
FIG. 19 is a schematic sectional view illustrating another structure example of the memory cell.
Figure 20:
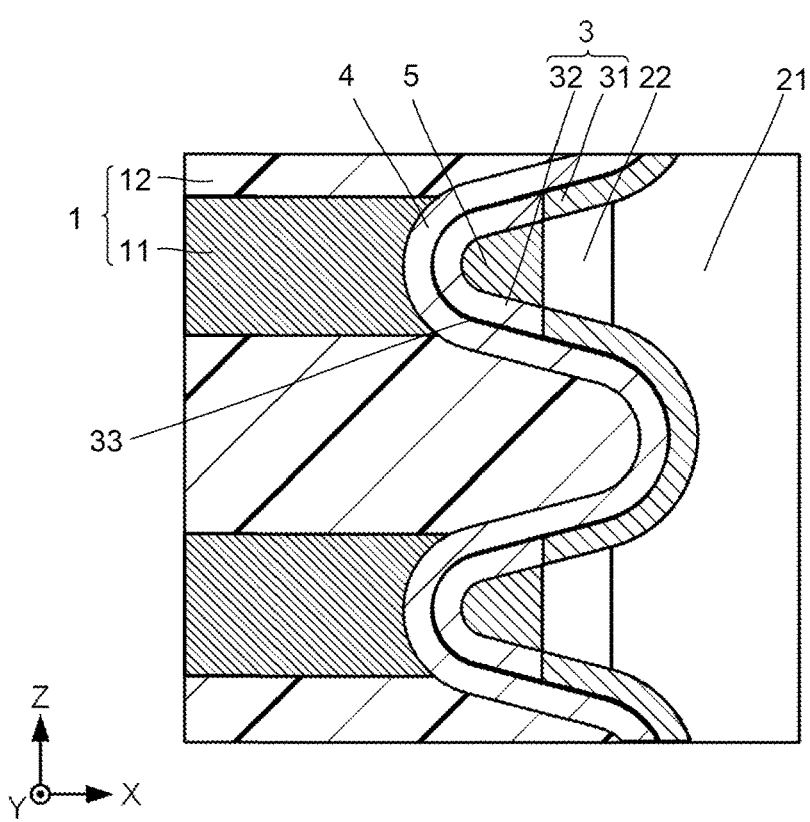
FIG. 20 is a schematic sectional view illustrating another structure example of the memory cell.

The structure of the memory cell for physically separating the regions 32 is not limited to the structure illustrated in FIG. 3. Each of FIG. 19 and FIG. 20 is a schematic sectional view illustrating another structure example of the memory cell, and illustrates the X-Z cross section. Explanation of parts same as those of FIG. 3 will be omitted in this structure example.

FIG. 19 illustrates the region 31 containing silicide or impurity-doped silicon, and the memory layer 5 extending between the region 31 and the insulation layer 21 and between the region 32 and the insulation layer 21. As illustrated in FIG. 19, the memory layer 5 may be formed to be in contact with the region 31 containing the silicide or the impurity-doped silicon. Further, in FIG. 19, a face on the opposite side of the memory layer 5 from the region 32 may be provided to be flush with a face on the opposite side of the memory layer 5 from the region 31 or be farther from the wiring layer 11 than the face, same as those in FIG. 18.

FIG. 20 illustrates a protruding region 32 having a tapered face 33 with respect to the Z axis direction. There is a concern that a protruding region 32 having side faces parallel to the X axis direction is interfered by the word line WL corresponding to the adjacent memory cell. In contrast, the formation of the tapered face 33 on the region 32, can prevent the interference. The tapered face 33 can be formed in a manner that, after partially removing a face of the insulation layer 12 facing the memory hole MH by isotropic etching, the insulation layer 4 and the semiconductor layer 3 are formed.

Further, in the first structure example, the division of the memory layer 5 for each memory cell can prevent the heat conduction between the adjacent memory cells to prevent the operation failure such as the erroneous writing. In addition, the formation of the insulation layer 22, which is in contact with the memory layer 5 in the X axis direction and provided along the memory layer 5 in the X-Y cross section, further prevents the heat conduction between the adjacent memory cells.

Figure 21:
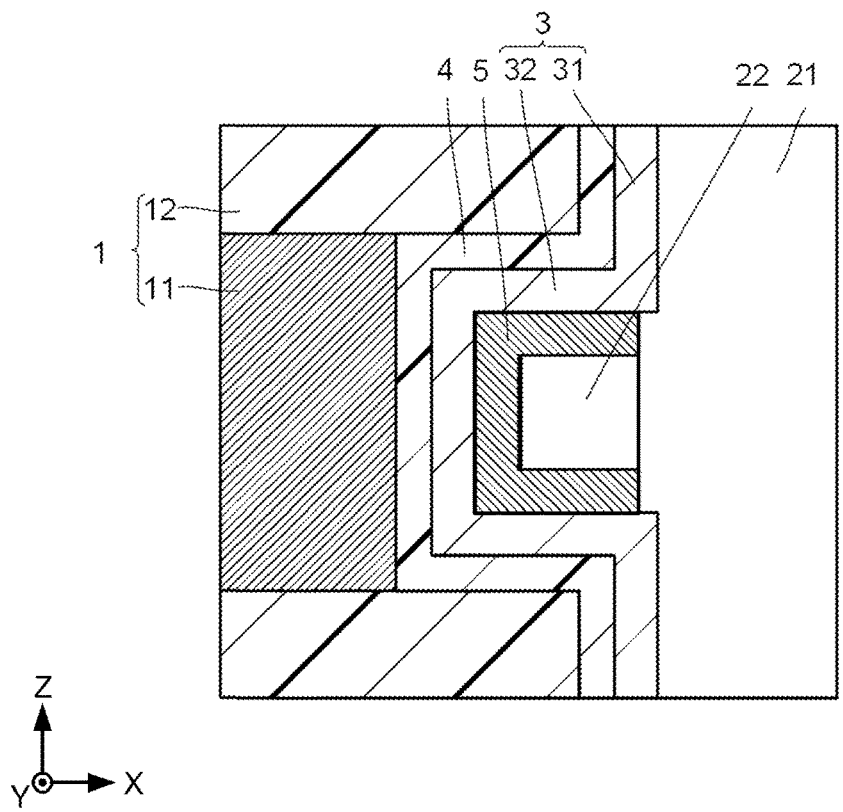
FIG. 21 is a schematic sectional view illustrating another structure example of the memory cell.
Figure 22:
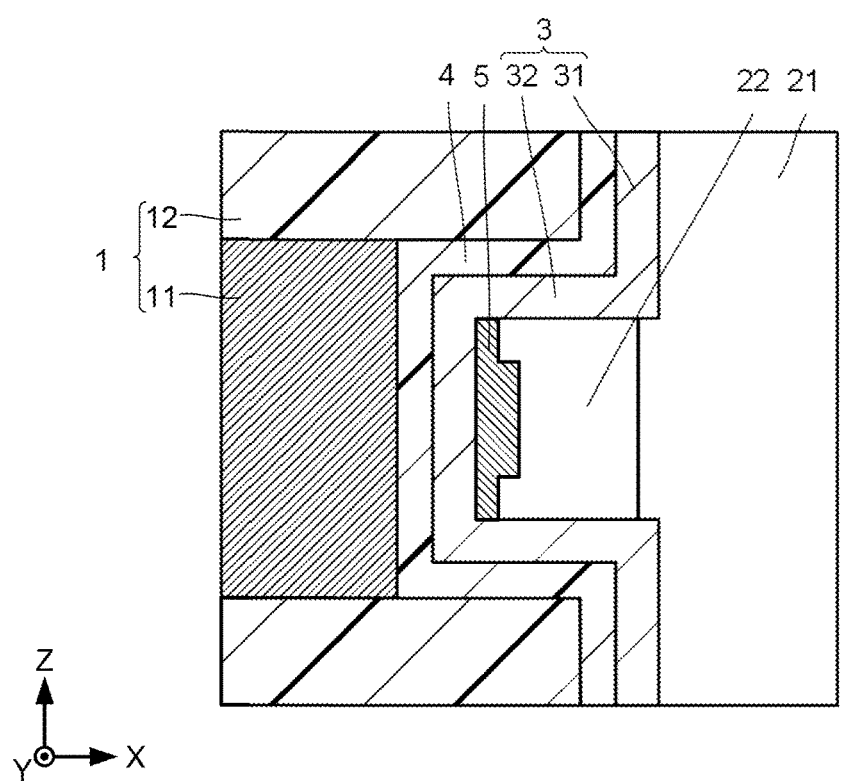
FIG. 22 is a schematic sectional view illustrating another structure example of the memory cell.

The structure in which the memory layer 5 is divided for each memory cell is not limited to the structure illustrated in FIG. 3. Each of FIG. 21 and FIG. 22 is a schematic sectional view illustrating another structure example of the memory cell, and illustrates the X-Z cross section. Explanation of parts same as those of FIG. 3 will be omitted in this structure example.

FIG. 21 illustrates the insulation layer 22 provided between growth faces of the divided memory layer 5, the growth faces facing to each other. As illustrated in FIG. 21, the insulation layer 22 is formed as a core material of the protrusion of the region 32 so as to overlap with the memory layer 5 in the X axis direction and provided along the memory layer 5 in the X-Y cross section, resulting in achieving easily retain heat. This can prevent the heat conduction between adjacent memory cells. The structure is not limited to this structure example. As illustrated in FIG. 22, the growth faces of the divided memory layer 5 may be removed, and then the insulation layer 22 may be formed.

In the first structure example, the memory layer 5 may be formed using a superlattice layer. Examples of the superlattice layer include a multilayer film having a plurality of c-axis oriented layers. The superlattice layer can be applied to a memory layer of a phase-change memory such as iPCM or a memory layer of FeRAM.

Figure 23:
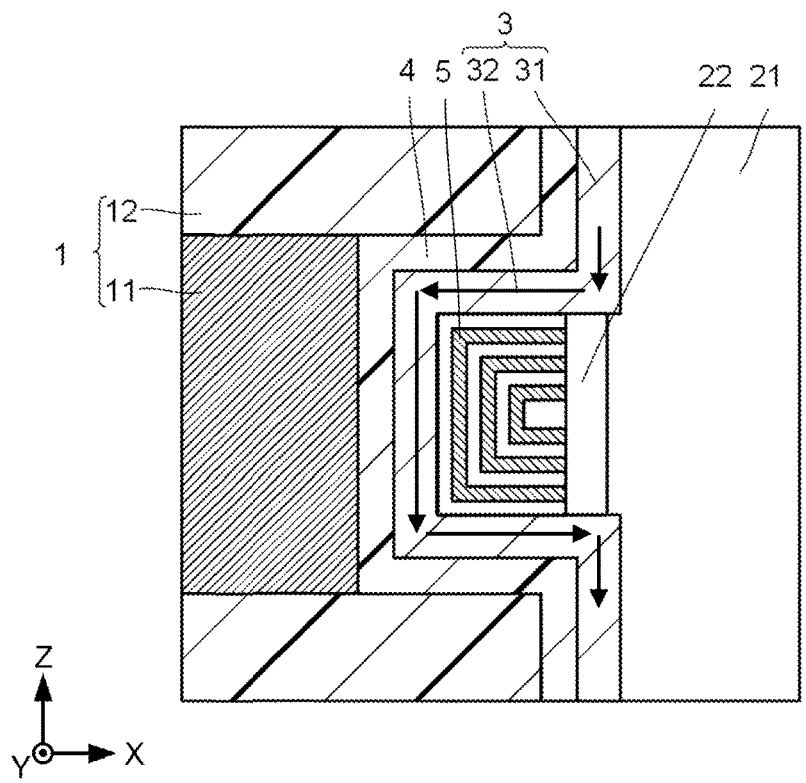
FIG. 23 is a schematic view illustrating a current path of a memory cell when a word line WL is not selected.

FIG. 23 is a schematic view illustrating a current path of a memory cell when a word line WL is not selected. When the word line WL is not selected, the switch transistor SW is turned into an on-state, and a current flows through the region 32.

Figure 24:
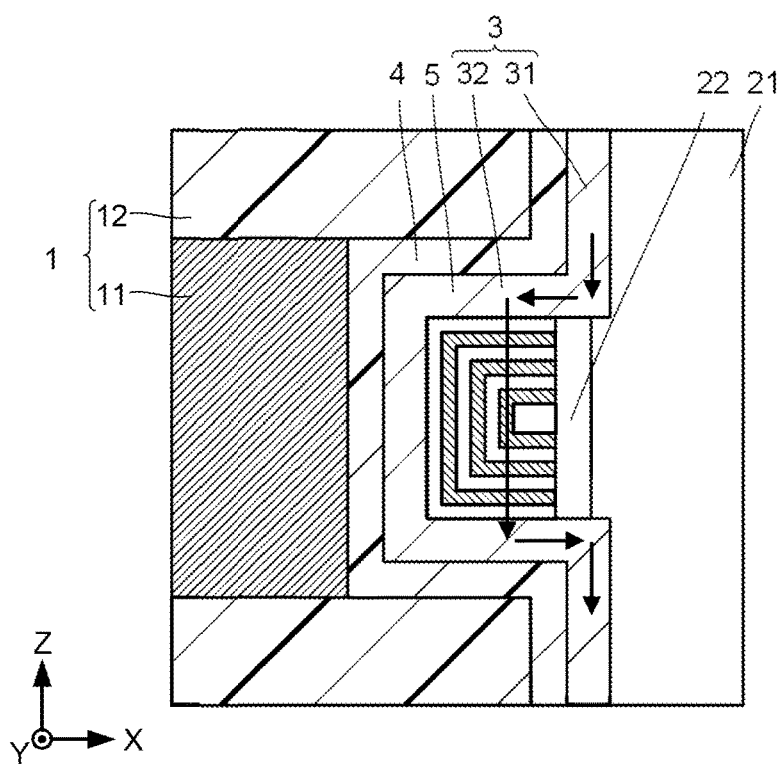
FIG. 24 is a schematic view illustrating a current path of the memory cell when the word line WL is selected.

FIG. 24 is a schematic view illustrating a current path of the memory cell when the word line WL is selected. When the word line WL is selected, the switch transistor SW is turned into an off-state. In the present embodiment, a shape of the region 32 and a shape of a divided part of the memory layer 5 are controlled to adjust a width of a depletion layer which is formed when the word line WL is selected, which enables to make the current flow along the c axis of the superlattice layer of the memory layer 5, as illustrated in FIG. 24. When the silicide or the impurity-containing silicon is not formed in the region 31, the memory layer 5 may continuously extend between the region 31 and the region 32, and the insulation layer 21.

Figure 25:
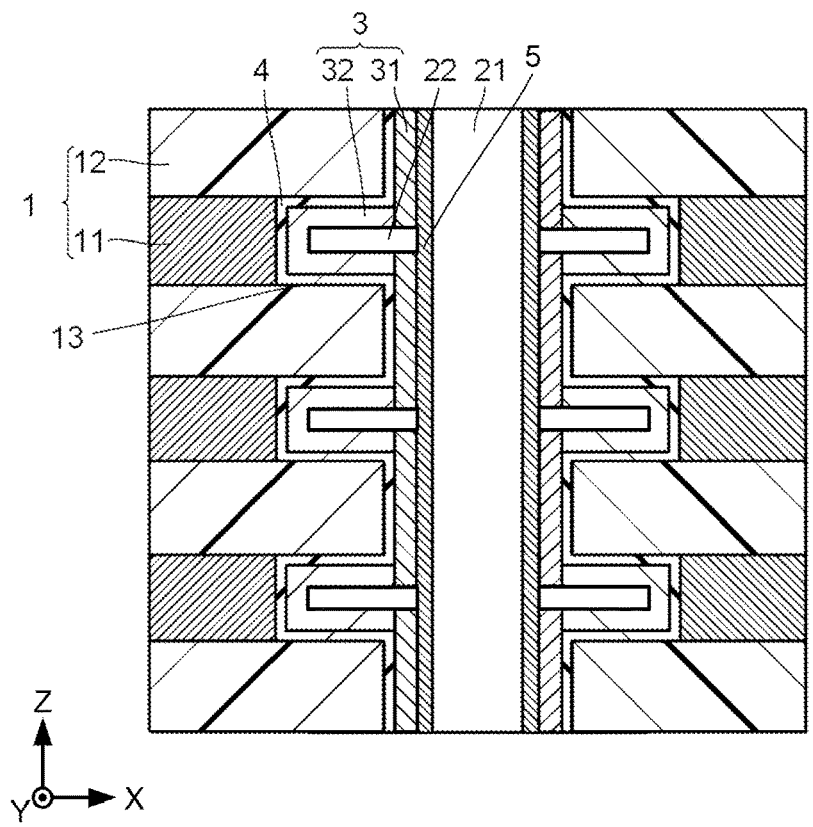
FIG. 25 is a schematic sectional view illustrating another structure example of the memory cell.
Figure 26:
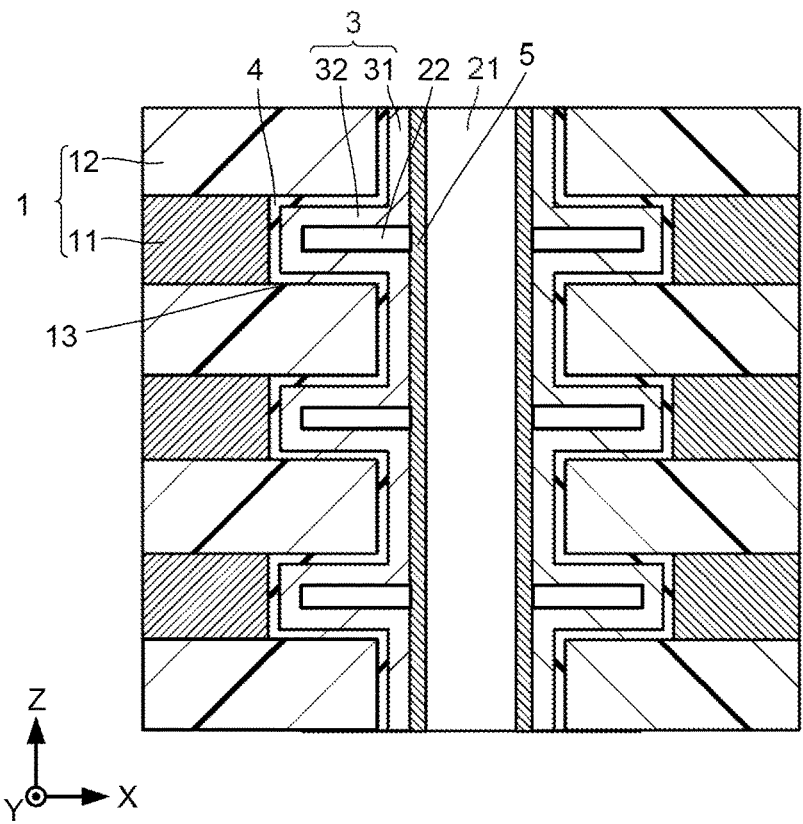
FIG. 26 is a schematic sectional view illustrating another structure example of the memory cell.

The first structure example is not limited to the above-described structures. Each of FIG. 25 and FIG. 26 is a schematic sectional view illustrating another example of the first structure example, and illustrates the X-Z cross section. Explanation of parts same as those of the other structure examples will be omitted in this structure example.

FIG. 25 illustrates the memory layer 5 which is brought into contact with the region 31, and the insulation layer 22 between the region 32 and the memory layer 5. The region 31 is a compound region containing at least one element selected from the group consisting of silicon and germanium, and at least one element selected from the group consisting of tungsten, rhenium, and lead. The memory layer 5 contains antimony and tellurium.

When the region 31 contains metal other than tungsten, rhenium, and lead, the metal forms a compound with antimony and tellurium of the memory layer 5, resulting in that an orientation deviation is likely to occur in the memory layer 5. In contrast, in the structure example illustrated in FIG. 25, the region 31 and the memory layer 5 are formed by using the above-described materials, respectively, to prevent the orientation deviation in the memory layer 5. Further, the formation of the insulation layer 22 between the region 32 and the memory layer 5, can physically separate the regions 32 each. The insulation layer 22 can be formed by the CVD method before forming the memory layer 5, for example.

The structure in FIG. 26 is different from the structure illustrated in FIG. 25 in that the region 31 contains polysilicon. As described above, when the region 31 contains metal other than tungsten, rhenium, and lead, the metal forms a compound with antimony and tellurium in the memory layer 5 to easily lead to the orientation deviation in the memory layer 5. In contrast, the formation of the region 31 with the use of polysilicon, enables to prevent the orientation deviation in the memory layer 5.

Second Structure Example

Figure 27:
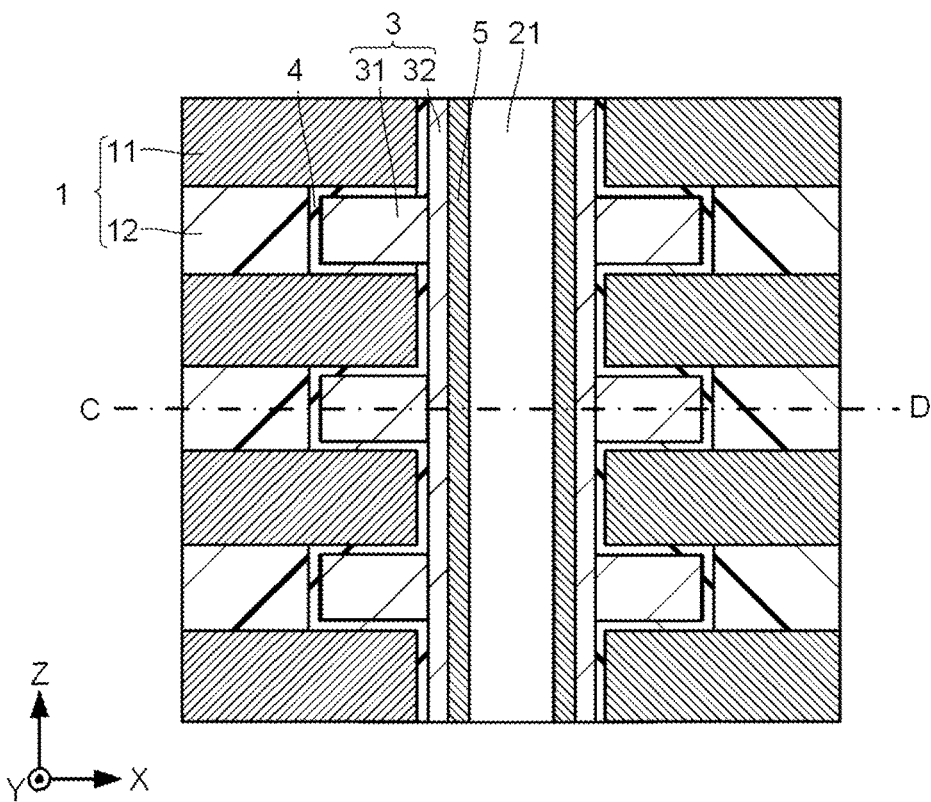
FIG. 27 is a schematic sectional view for explaining a second structure example of the NAND string NS.
Figure 28:
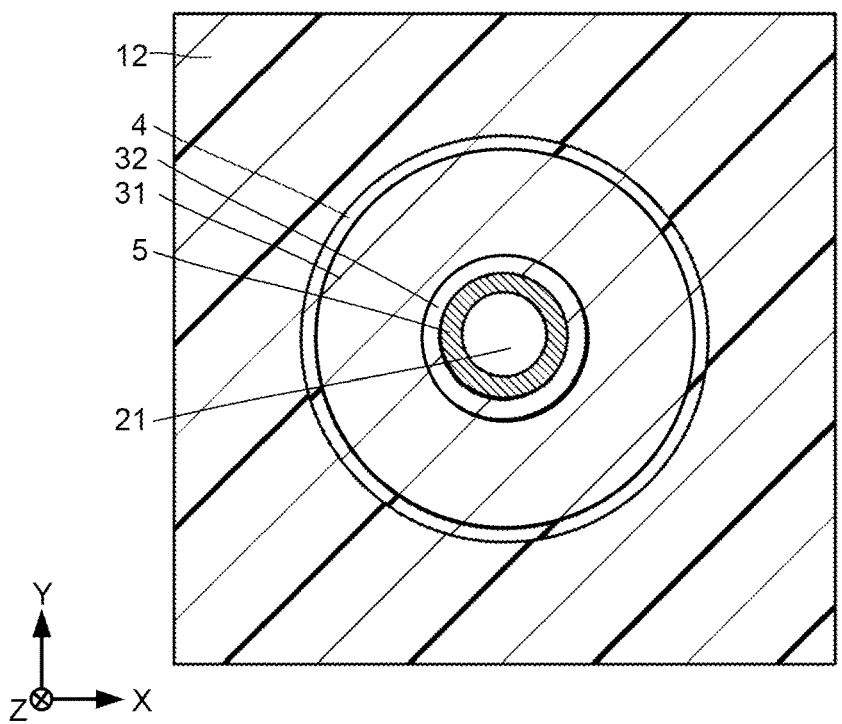
FIG. 28 is a schematic sectional view along a line C-D in FIG. 27.

FIG. 27 is a schematic sectional view for explaining the second structure example of the NAND string NS, and illustrates a part of X-Z cross section. FIG. 28 is a schematic sectional view along a line C-D in FIG. 27, and illustrates a part of X-Y cross section.

As illustrated in FIG. 27 and FIG. 28, the NAND string NS includes a stack 1, an insulation layer 21, a semiconductor layer 3, an insulation layer 4, and a memory layer 5.

The stack 1 includes a wiring layer 11 and an insulation layer 12. Each of a plurality of the wiring layers 11 and each of a plurality of the insulation layers 12 are alternately stacked along the Z axis direction. The wiring layer 11 forms a word line WL and a gate electrode of the switch transistor SW, and extends along the X axis direction. Examples of the wiring layer 11 include a conductive layer such as a tungsten layer. Examples of the insulation layer 12 include a silicon oxide layer.

The insulation layer 21 is provided along a direction (Z axis direction) in which the wiring layer 11 and the insulation layer 12 are stacked, for example. The insulation layer 21 can function as a core insulator. The insulation layer 21 has a columnar shape, for example. Examples of the insulation layer 21 include a silicon oxide layer.

As illustrated in FIG. 28, the semiconductor layer 3 surrounds the insulation layer 21 in the X-Y cross section. The semiconductor layer 3 includes a region 31 and a region 32, the region 31 being provided between the insulation layer 12 and the insulation layer 21 and overlapping with the insulation layer 12 in the X axis direction, and the region 32 being provided between the wiring layer 11 and the insulation layer 21 and overlapping with the wiring layer 11 in the X axis direction. The region 31 and the region 32 are continued to each other. A plurality of the regions 31 is physically separated.

The region 31 and the region 32 contain polysilicon, for example. An electric resistivity of the region 31 is preferably lower than an electric resistivity of the region 32. In order to reduce the electric resistivity of the region 31, the region 31 may also contain the silicide or the impurity-doped silicon. Further, the region 31 may contain metal and a metal nitride, and the region 31 may contain at least one metal element selected from the group consisting of tungsten, molybdenum, tantalum, titanium, cobalt, nickel, and platinum, or at least one metal nitride containing the at least one metal element selected from the group consisting of the metal elements.

The region 31 forms a source region or a drain region of the switch transistor SW. The region 32 forms a channel region of the switch transistor SW.

The insulation layer 12 is farther from the region 32 than the wiring layer 11 in the X axis direction. The region 31 has a part (protrusion) provided between the wiring layers 11 in the Z axis direction and protruding further toward the insulation layer 12 than the region 32 in the X axis direction.

The insulation layer 4 is provided between the wiring layer 11 and the region 32. The insulation layer 4 forms a gate insulation layer of the switch transistor SW. Examples of the insulation layer 4 include a silicon oxide layer.

The memory layer 5 is provided on the opposite side of the region 32 from the wiring layer 11 in the X axis direction. Further, the memory layer 5 may also be provided on the opposite side of the region 31 from the insulation layer 12 in the X axis direction. The memory layer 5 forms the variable resistor R. The memory layer 5 extends between the insulation layer 21 and the region 32. The memory layer 5 includes, for example, the resistance-change layer or the capacitance-change layer. Explanation in this structure example will be made on a case where a resistance-change film containing a Ge—Sb—Te-based chalcogenide compound is used, as an example.

Next, an example of a method of manufacturing the NAND string NS illustrated in FIG. 27 will be described. FIG. 29 to FIG. 36 are schematic sectional views for explaining the example of the method of manufacturing the NAND string NS illustrated in FIG. 27, and each of which illustrates a part of X-Z cross section.

Figure 29:
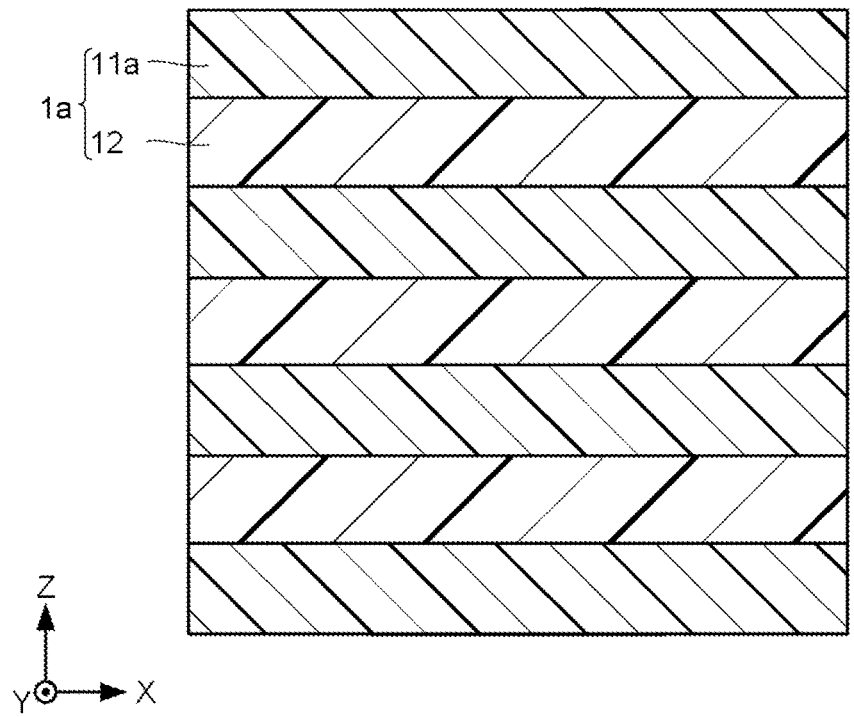
FIG. 29 is a schematic sectional view for explaining an example of a method of manufacturing the NAND string NS illustrated in FIG. 27.

First, as illustrated in FIG. 29, each of the insulation layers 11a and each of the insulation layers 12 are alternately stacked along the Z axis direction to form a stack 1a. The insulation layer 11a is a sacrificial layer. The sacrificial layer is a layer used for forming a cavity later. Examples of the insulation layer 11a include a silicon nitride layer.

Figure 30:
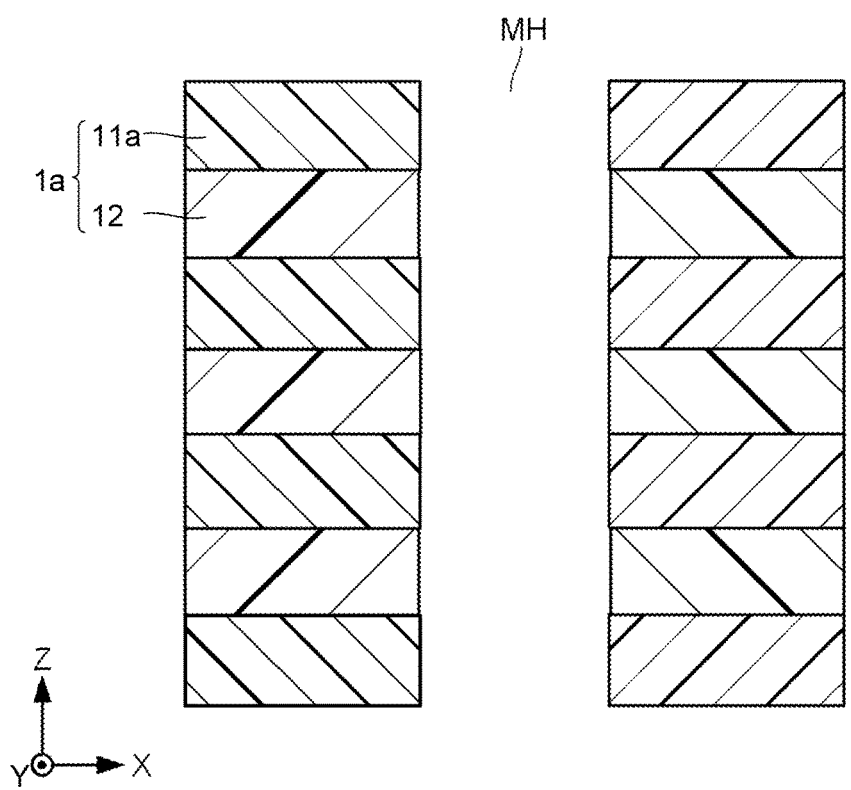
FIG. 30 is a schematic sectional view for explaining the example of the method of manufacturing the NAND string NS illustrated in FIG. 27.

Next, as illustrated in FIG. 30, the stack 1a is processed and thus a memory hole MH is formed, the memory hole MH penetrating with the stack 1a along the Z axis direction. The stack 1a can be processed by ME, for example.

Figure 31:
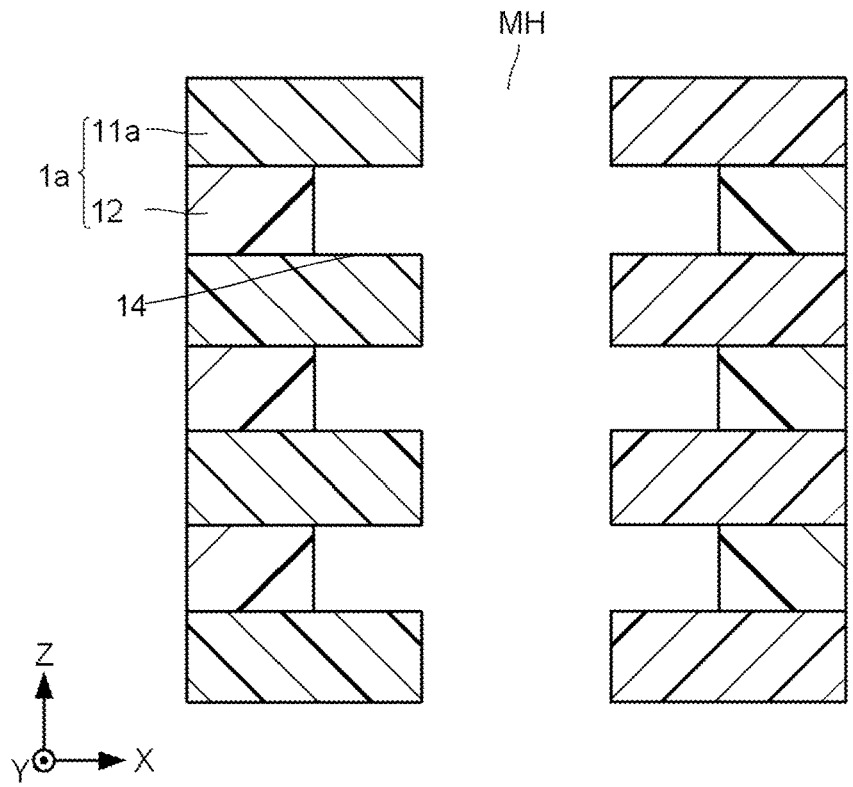
FIG. 31 is a schematic sectional view for explaining the example of the method of manufacturing the NAND string NS illustrated in FIG. 27.

Next, as illustrated in FIG. 31, the insulation layer 12 is partially removed along the X-Y cross section, and thus an inner groove 14 in the stack 1a is formed. The inner groove 14 is provided between one of the wiring layers 11 and another one of the wiring layers 11 in the Z axis direction, and overlaps with the insulation layer 12 in the X axis direction. The insulation layer 12 can be partially removed by the dry etching, for example.

Figure 32:
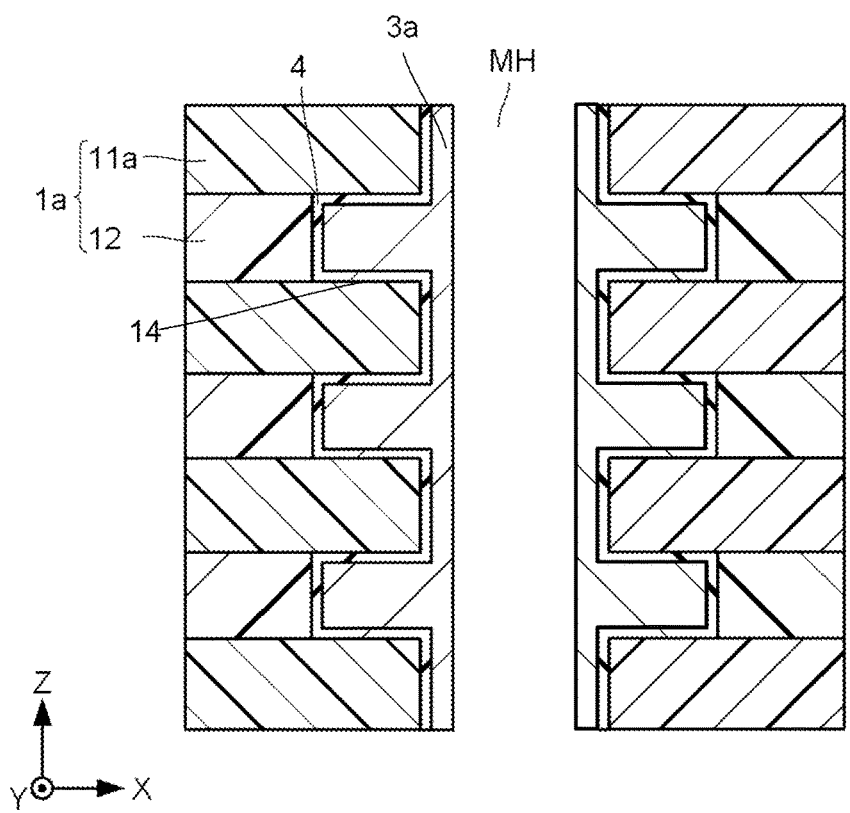
FIG. 32 is a schematic sectional view for explaining the example of the method of manufacturing the NAND string NS illustrated in FIG. 27.

Next, as illustrated in FIG. 32, the insulation layer 4 is formed on a face of the insulation layer 11a facing the memory hole MH and a face of the insulation layer 12 facing the memory hole MH, and a semiconductor layer 3a filling the inner groove 14 is formed on a surface of the insulation layer 4. The semiconductor layer 3a and the insulation layer 4 can be formed by, for example, the CVD method or the ALD method. The semiconductor layer 3a contains impurity-doped silicon, for example.

Figure 33:
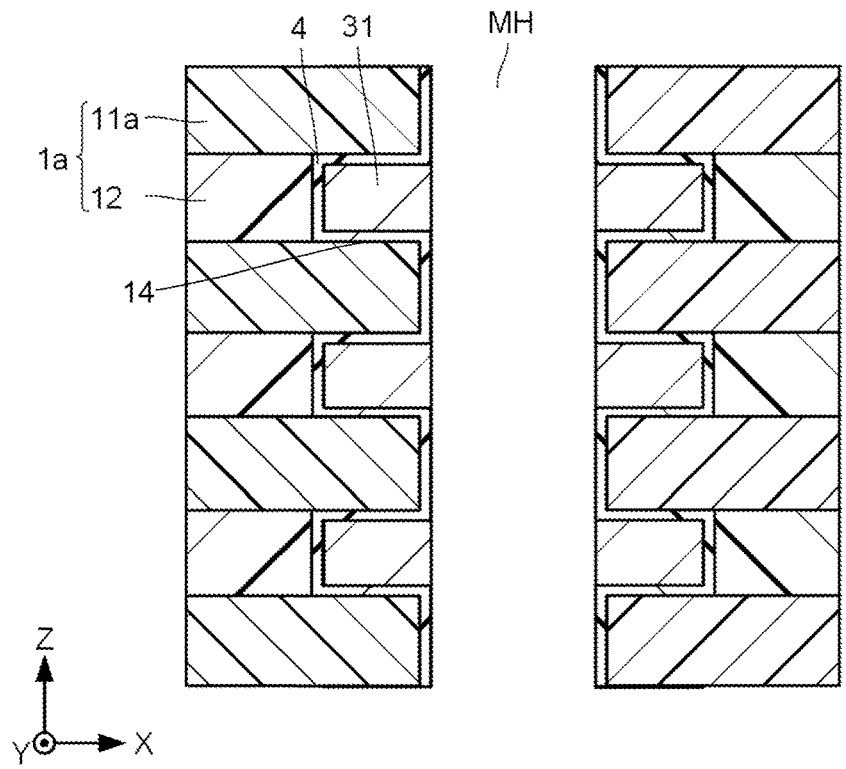
FIG. 33 is a schematic sectional view for explaining the example of the method of manufacturing the NAND string NS illustrated in FIG. 27.

Next, as illustrated in FIG. 33, the semiconductor layer 3a is partially removed and thus the region 31 is formed. The semiconductor layer 3a can be partially removed by the dry etching or the wet etching, for example.

Figure 34:
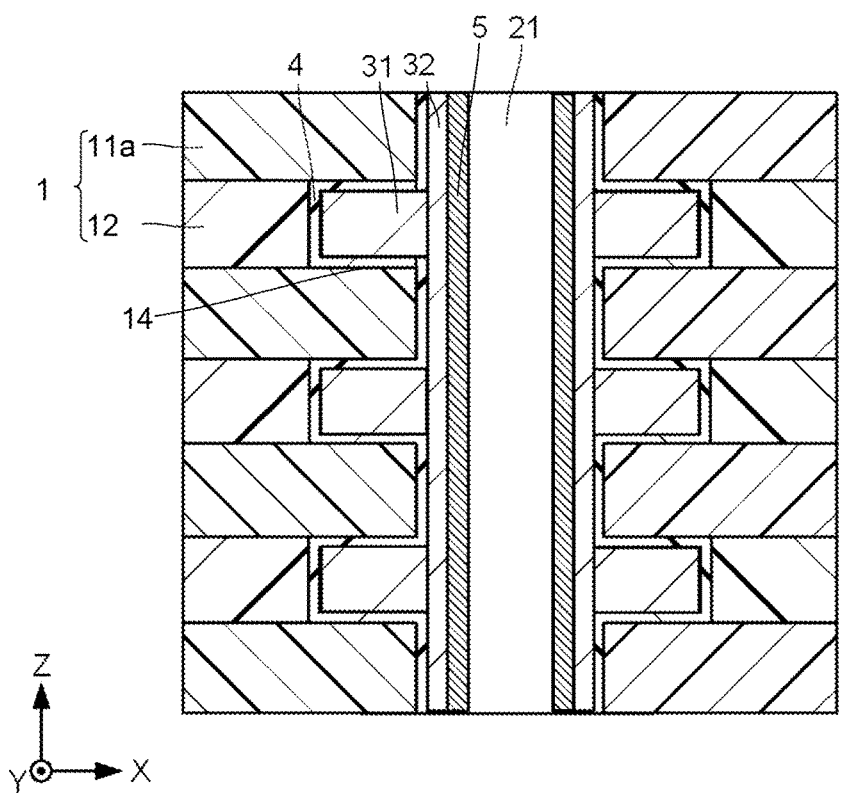
FIG. 34 is a schematic sectional view for explaining the example of the method of manufacturing the NAND string NS illustrated in FIG. 27.

Next, as illustrated in FIG. 34, a semiconductor layer is formed on a surface of an exposed portion of the region 31 and the insulation layer 4 in the memory hole MH and thus the region 32 is formed, and the memory layer 5 is formed on a surface of the region 32. The semiconductor layer contains polysilicon, for example. The semiconductor layer can be formed by the CVD method or the ALD method, for example. The memory layer 5 can be formed by the CVD method or the ALD method, for example.

Next, as illustrated in FIG. 34, the insulation layer 21 filling the memory hole MH is formed. The insulation layer 21 can be formed by the CVD method or the ALD method, for example.

Figure 35:
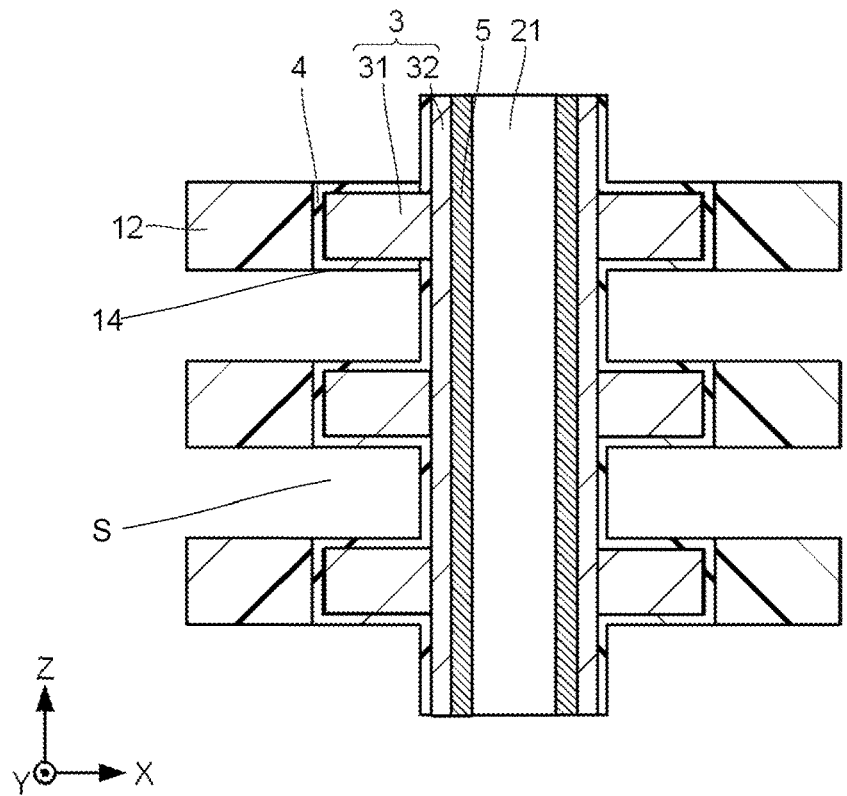
FIG. 35 is a schematic sectional view for explaining the example of the method of manufacturing the NAND string NS illustrated in FIG. 27.

Next, as illustrated in FIG. 35, the insulation layer 11a is removed and thus a cavity S is formed. The insulation layer 11a is removed by the dry etching or the wet etching, for example.

Figure 36:
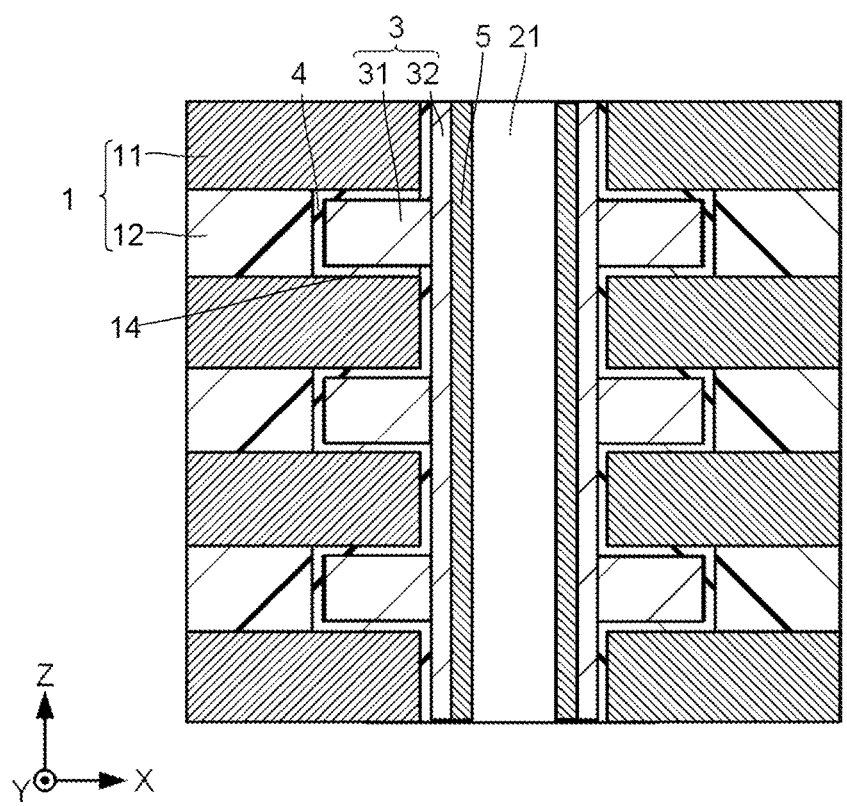
FIG. 36 is a schematic sectional view for explaining the example of the method of manufacturing the NAND string NS illustrated in FIG. 27.

Next, as illustrated in FIG. 36, the wiring layer 11 is formed in the cavity S. The above-described process can form a plurality of memory cells including the switch transistors SW and the variable resistors R.

In the second structure example, the formation of the protrusion on the region 31 of the semiconductor layer 3, reduces an electric resistance of the source region and an electric resistance of the drain region, of the switch transistor SW, resulting in the flow of a large amount of current.

The protrusion of the region 31 forms a capacitor between upper and lower wiring layers 11 to enable to control the channel region by two adjacent word lines WL. Control of electric potentials of the two word lines WL preferably prevent erroneous writing or erroneous reading with respect to adjacent memory cells.

Figure 37:
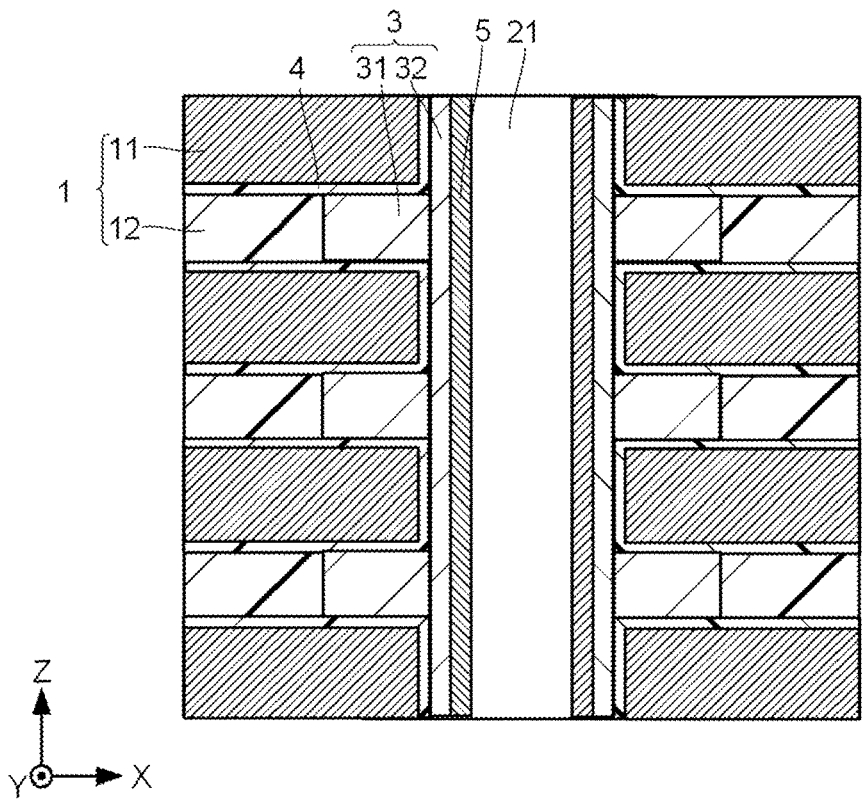
FIG. 37 is a schematic sectional view illustrating another structure example of the memory cell.
Figure 38:
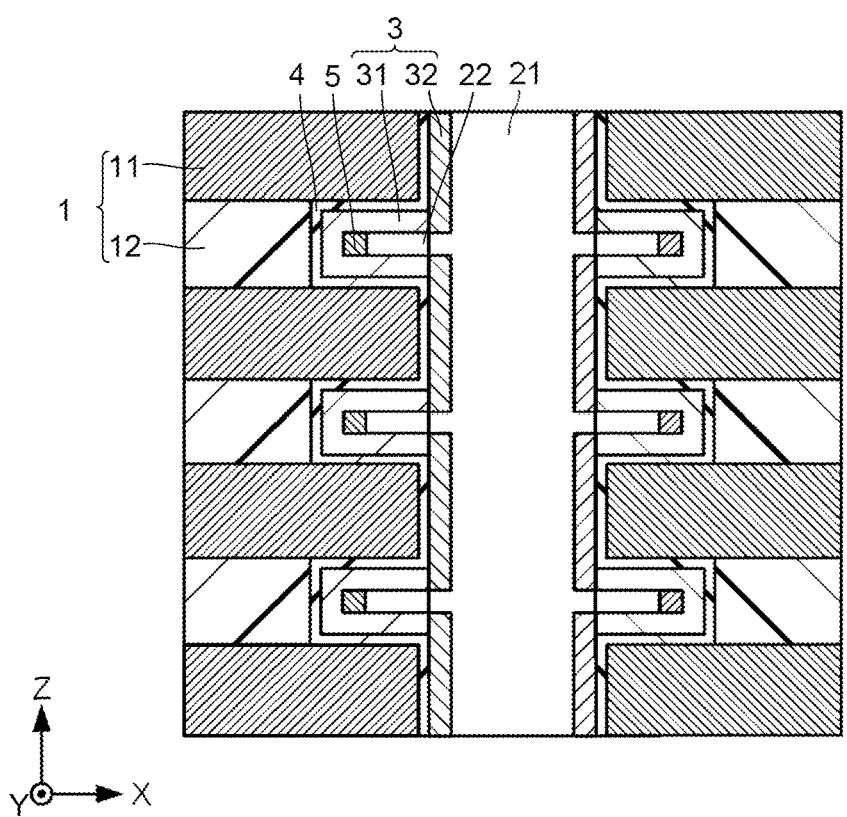
FIG. 38 is a schematic sectional view illustrating another structure example of the memory cell.

The second structure example is not limited to the structure illustrated in FIG. 27. Each of FIG. 37 and FIG. 38 is a schematic sectional view illustrating another structure example of the memory cell, and illustrates the X-Z cross section. Explanation of parts same as those of FIG. 27 will be omitted in this structure example.

FIG. 37 illustrates the insulation layer 4 that extends between the wiring layer 11 and the region 32 along the Z axis direction and extends between the wiring layer 11 and the insulation layer 12 along the X axis direction. As illustrated in FIG. 37, the insulation layer 4 does not always have to extend between the insulation layer 12 and the region 31 along the X axis direction. The insulation layer 4 illustrated in FIG. 37 can be formed in a manner that, after forming the cavity S as illustrated in FIG. 35, the insulation layer 4 is formed in the cavity S before forming the wiring layer 11, without forming the insulation layer 4 after forming the inner groove 14, as illustrated in FIG. 31.

FIG. 38 illustrates the memory layer 5 physically separated for each memory cell, and the region 32 containing silicide, similarly to FIG. 3. The formation of the silicide in the regions 32, achieves the electric resistivity of the region 32 smaller than the electric resistivity of the region 31. This enables to physically separate the regions 31 by the regions 32 to use the regions 31 to n-channel type transistors and p-channel type transistors, for example.

The each configuration of the second structure example may be appropriately combined with the each configuration of the first structure example.

Third Structure Example

Figure 39:
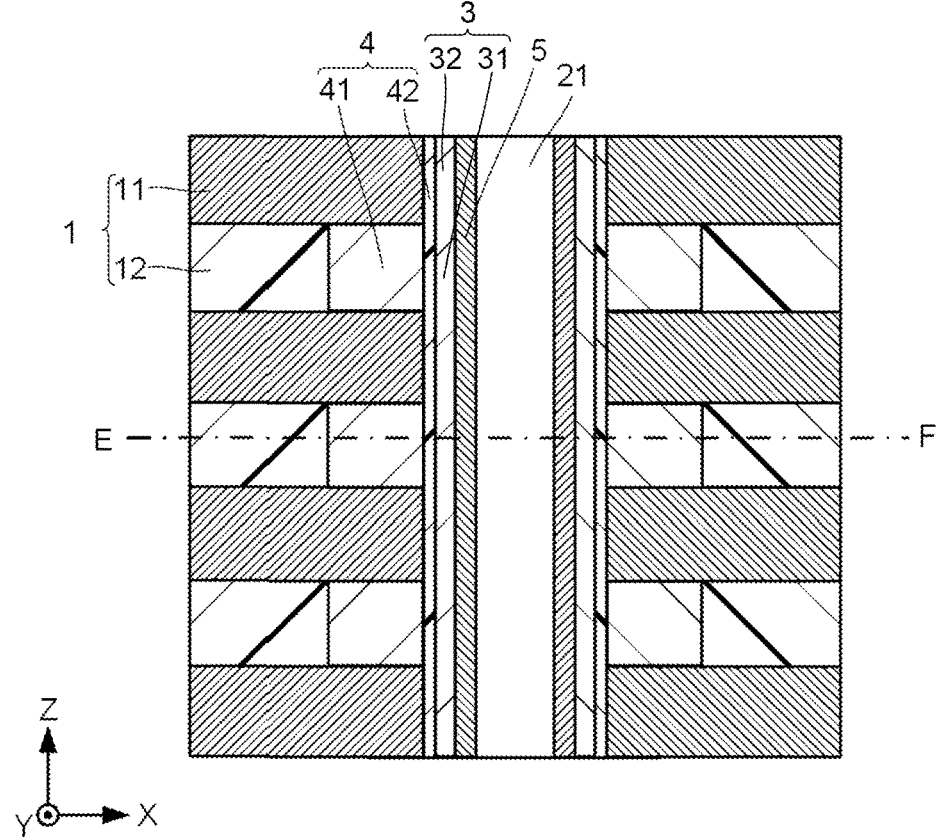
FIG. 39 is a schematic sectional view illustrating a third structure example of the NAND string NS.
Figure 40:
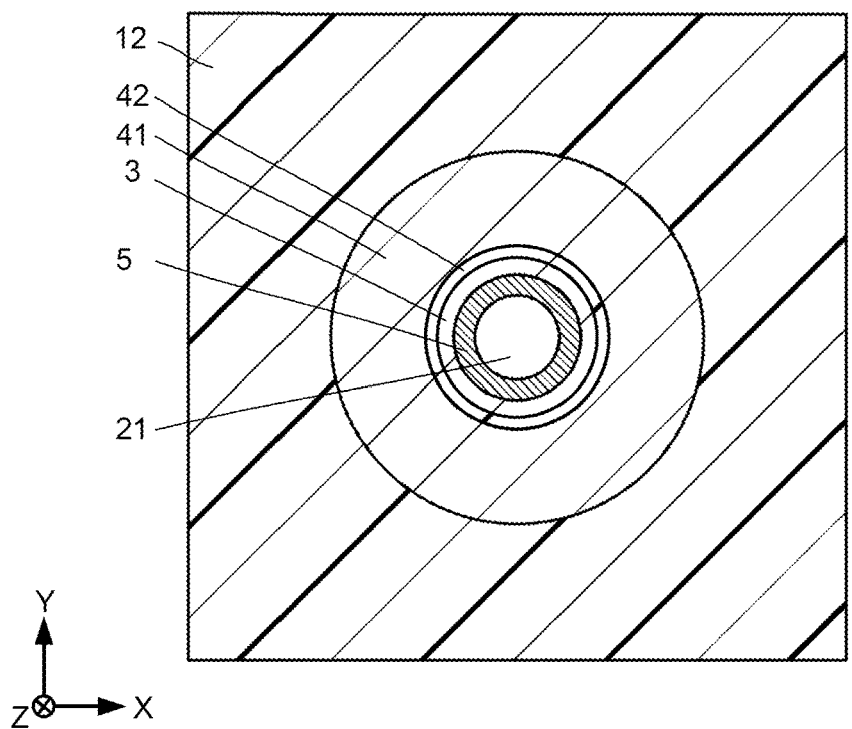
FIG. 40 is a schematic sectional view along a line E-F in FIG. 39.

FIG. 39 is a schematic sectional view illustrating the third structure example of the NAND string NS, and illustrates a part of X-Z cross section. FIG. 40 is a schematic sectional view along a line E-F in FIG. 39, and illustrates a part of X-Y cross section.

As illustrated in FIG. 39 and FIG. 40, the NAND string NS includes a stack 1, an insulation layer 21, a semiconductor layer 3, an insulation layer 4, and a memory layer 5.

The stack 1 includes a plurality of wiring layers 11 and a plurality of insulation layers 12. Each of the wiring layers 11 and each of the insulation layers 12 are alternately stacked along the Z axis direction. The wiring layer 11 forms a word line WL and a gate electrode of the switch transistor SW, and extends along the X axis direction. Examples of the wiring layer 11 include a conductive layer such as a tungsten layer. Examples of the insulation layer 12 include a silicon oxide layer.

The insulation layer 21 is provided along a direction (Z axis direction) in which the wiring layer 11 and the insulation layer 12 are stacked, for example. The insulation layer 21 can function as a core insulator. The insulation layer 21 has a columnar shape, for example. Examples of the insulation layer 21 include a silicon oxide layer.

As illustrated in FIG. 40, the semiconductor layer 3 surrounds the insulation layer 21 in the X-Y cross section. The semiconductor layer 3 includes a region 31 which is provided between the insulation layer 12 and the insulation layer 21 and overlaps with the insulation layer 12 in the X axis direction, and a region 32 which is provided between the wiring layer 11 and the insulation layer 21 and overlaps with the wiring layer 11 in the X axis direction. The region 31 and the region 32 are continued to each other.

The region 32 forms a channel region of the switch transistor SW. The region 31 forms a source region or a drain region of the switch transistor SW.

The insulation layer 4 is provided between the wiring layer 11 and the region 32 and between the insulation layer 12 and the region 31. The insulation layer 4 forms a gate insulation layer of the switch transistor SW.

The insulation layer 4 includes a region 41 and a region 42, the region 41 being provided between the insulation layer 12 and the region 31 in the X axis direction, and the region 42 being provided between the wiring layer 11 and the region 32 in the X axis direction.

The insulation layer 12 is farther from the region 32 in the X axis direction than the wiring layer 11 is. The region 41 includes a part (protrusion) provided between the wiring layers 11 in the Z axis direction and protruding further toward the insulation layer 12 than the region 42 in the X axis direction. A plurality of the regions 41 is physically separated.

Examples of the region 41 include a high-dielectric insulation layer (High-K insulation layer). Examples of the high-dielectric insulation layer include an insulation layer having dielectric constant higher than that of a silicon oxide. Examples of the high-dielectric insulation layer include a hafnium oxide layer. Examples of the region 42 include a silicon oxide layer. Example of the region 42 is not limited to the silicon oxide layer, and the region 42 may include the high-dielectric insulation layer.

The memory layer 5 is provided on the opposite side of the region 32 from the wiring layer 11 and on the opposite side of the region 31 from the insulation layer 12.

The memory layer 5 is provided between the insulation layer 21 and the region 32 and between the insulation layer 21 and the region 31. The memory layer 5 forms the variable resistor R. The memory layer 5 includes, for example, the resistance-change layer or the capacitance-change layer. Here, explanation will be made on a case where a resistance-change layer containing a Ge—Sb—Te-based chalcogenide compound is used, as an example.

Next, an example of a method of manufacturing the NAND string NS illustrated in FIG. 39 will be described. FIG. 41 to FIG. 44 are schematic sectional views for explaining the example of the method of manufacturing the NAND string NS illustrated in FIG. 39, and each of which illustrates a part of X-Z cross section.

First, similarly to FIG. 29 to FIG. 31, the stack 1a, the memory hole MH, and the inner groove 14 are formed. The method of forming these is the same as that of the second structure example, so that explanation thereof will be omitted in this example.

Figure 41:
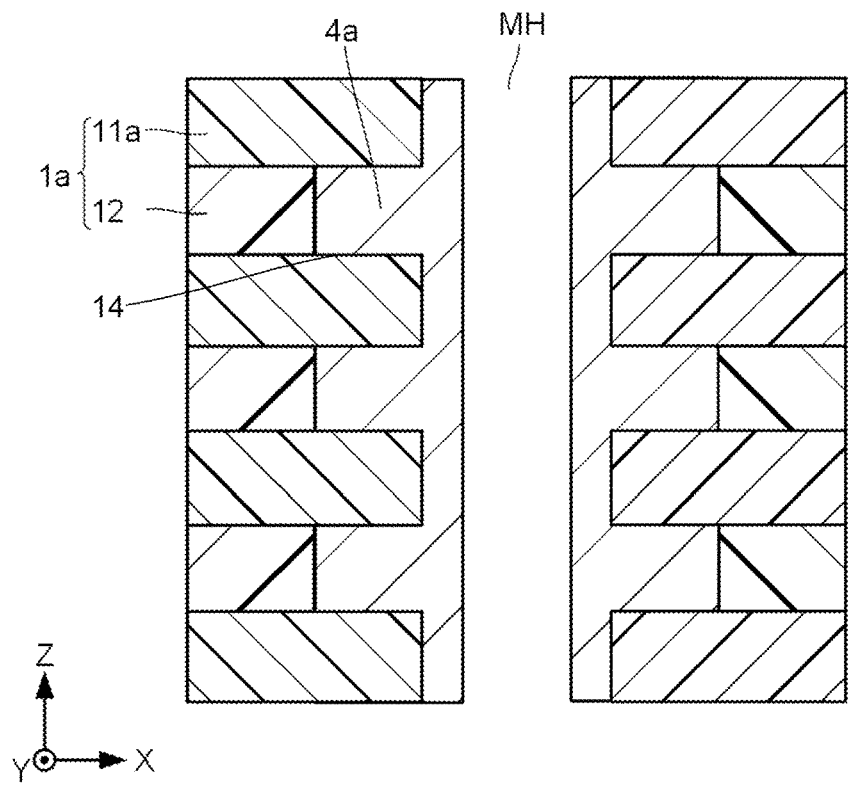
FIG. 41 is a schematic sectional view for explaining an example of a method of manufacturing the NAND string NS illustrated in FIG. 39.

Next, as illustrated in FIG. 41, an insulation layer 4a is formed in the inner groove 14. The insulation layer 4a can be formed by the CVD method or the ALD method, for example. Examples of the insulation layer 4a include a high-dielectric insulation layer.

Figure 42:
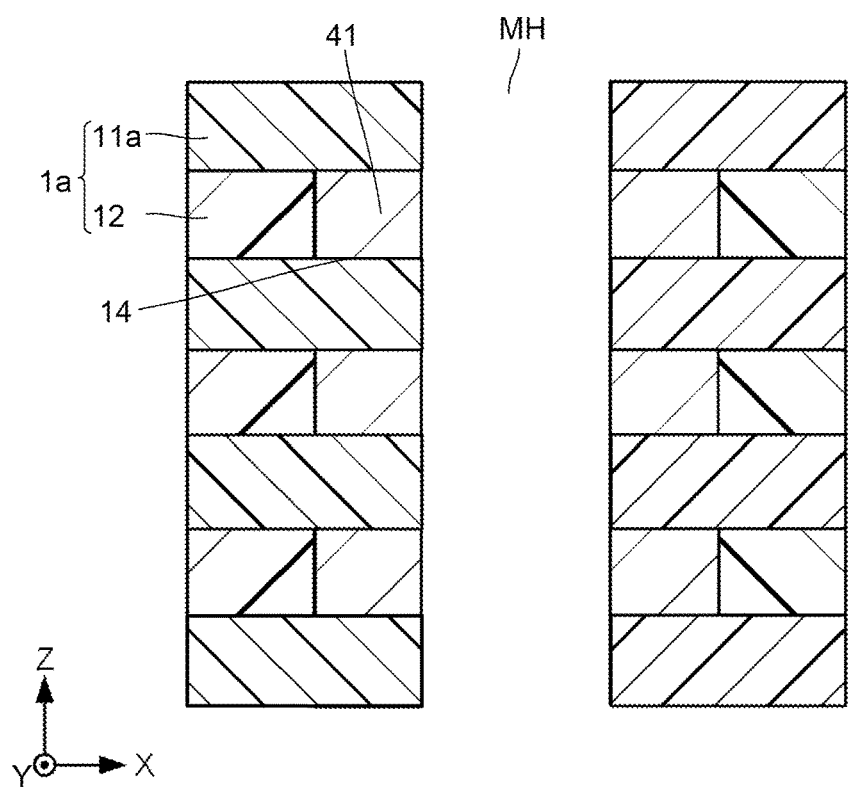
FIG. 42 is a schematic sectional view for explaining the example of the method of manufacturing the NAND string NS illustrated in FIG. 39.

Next, as illustrated in FIG. 42, the insulation layer 4a is partially removed to form the region 41. The insulation layer 4a can be partially removed by the dry etching or the wet etching, for example.

Figure 43:
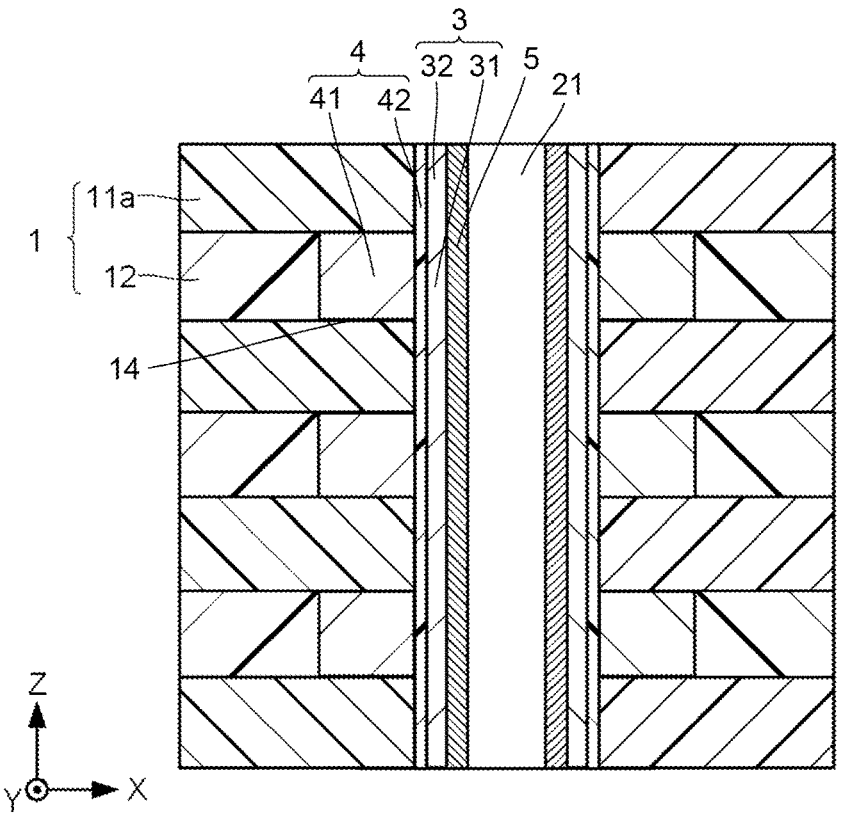
FIG. 43 is a schematic sectional view for explaining the example of the method of manufacturing the NAND string NS illustrated in FIG. 39.

Next, as illustrated in FIG. 43, an insulation layer is formed on a face facing the memory hole MH of the insulation layer 11a and a face facing the memory hole MH of the region 42, and thus the region 42 is formed. The region 42 can be formed by the CVD method or the ALD method, for example, and includes a silicon oxide film.

Further, as illustrated in FIG. 43, the semiconductor layer 3, the memory layer 5, and the insulation layer 21 are sequentially formed on a surface of the region 42. The method of forming these is the same as that of the second structure example, so that explanation thereof will be omitted in this example.

Figure 44:
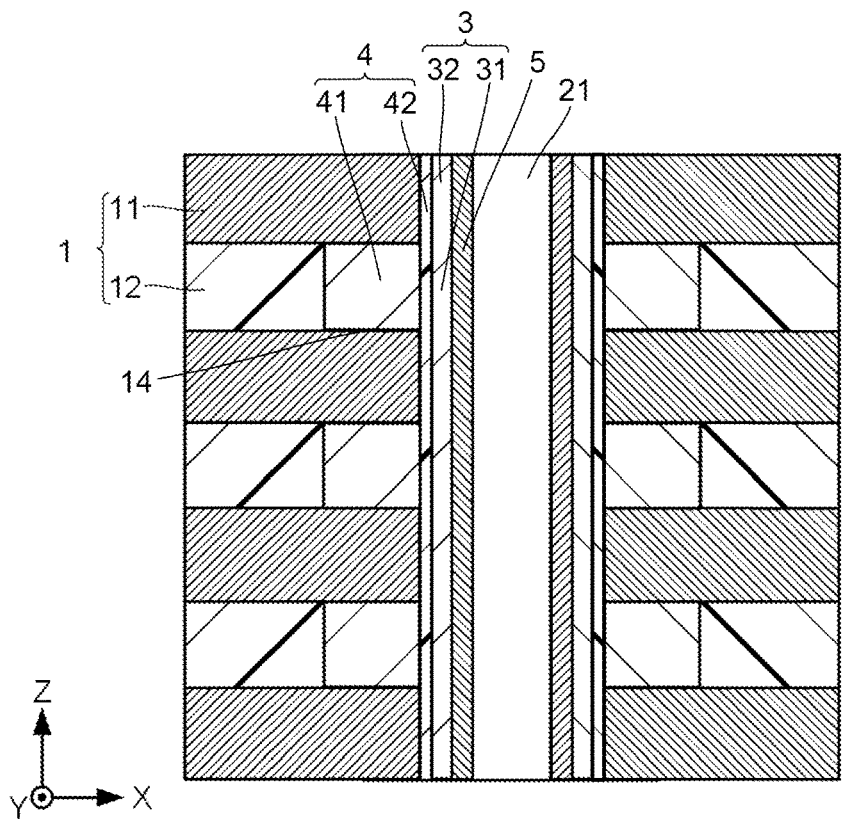
FIG. 44 is a schematic sectional view for explaining the example of the method of manufacturing the NAND string NS illustrated in FIG. 39.

Next, as illustrated in FIG. 44, the insulation layer 11a is removed and thus a cavity is formed, and then the wiring layer 11 is formed in the cavity. The method of forming these is the same as that of the second structure example, so that explanation thereof will be omitted in this example. The above-described process enables to form a plurality of memory cells.

In the third structure example, the process of protruding the region 41 of the insulation layer 4 between a pair of wiring layers 11, can form a protruding insulation region in the switch transistor SW.

The protruding insulation region forms a capacitor between upper and lower wiring layers 11, to increase a current density. This can decrease the electric resistivity of the region 32.

Figure 45:
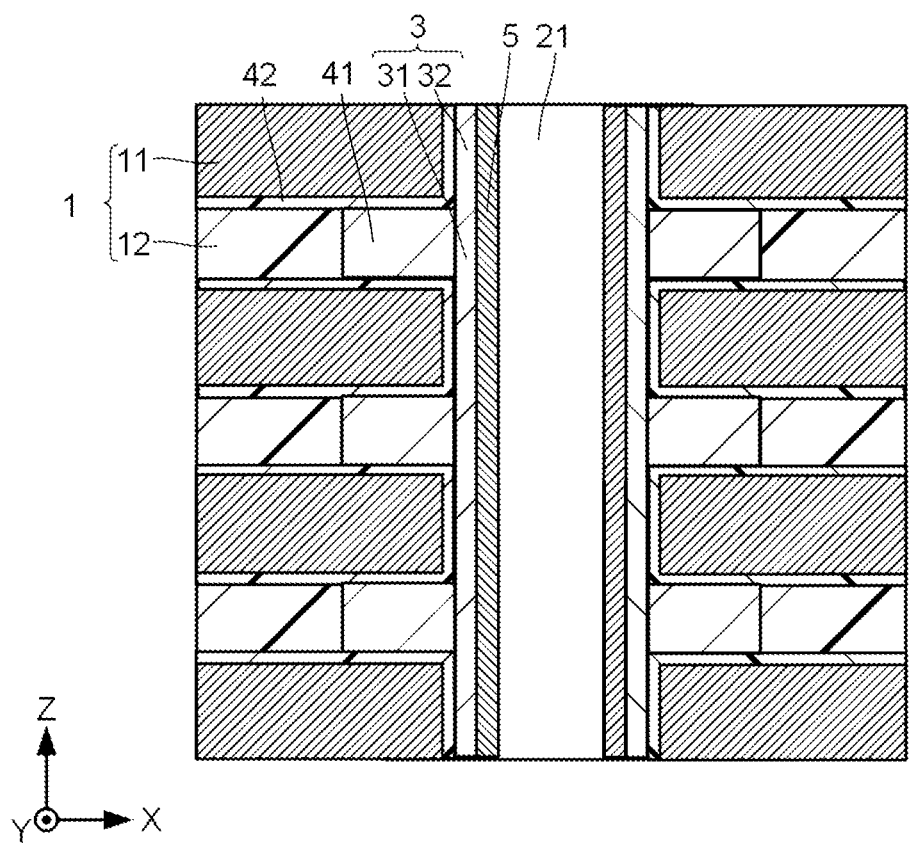
FIG. 45 is a schematic sectional view illustrating another structure example of the memory cell.

The third structure example is not limited to the structure illustrated in FIG. 39. FIG. 45 is a schematic sectional view illustrating another structure example of the memory cell. Explanation of parts same as those of FIG. 39 will be omitted in this structure example.

FIG. 45 illustrates the region 42 that extends between the wiring layer 11 and the region 32 along the Z axis direction and extends between the wiring layer 11 and the insulation layer 12 along the X axis direction. As illustrated in FIG. 45, the region 42 does not always have to extend between the insulation layer 12 and the region 31 along the X axis direction. As illustrated in FIG. 45, the region 42 illustrated in FIG. 45 is formed in a manner that, after forming the cavity S as illustrated in FIG. 35, the region 42 is formed in the cavity S before forming the wiring layer 11, without forming the region 42 after forming the inner groove 14.

The configurations of the third structure example may be appropriately combined with the configurations of the first structure example and the configurations of the second structure example.

Fourth Structure Example

Figure 46:
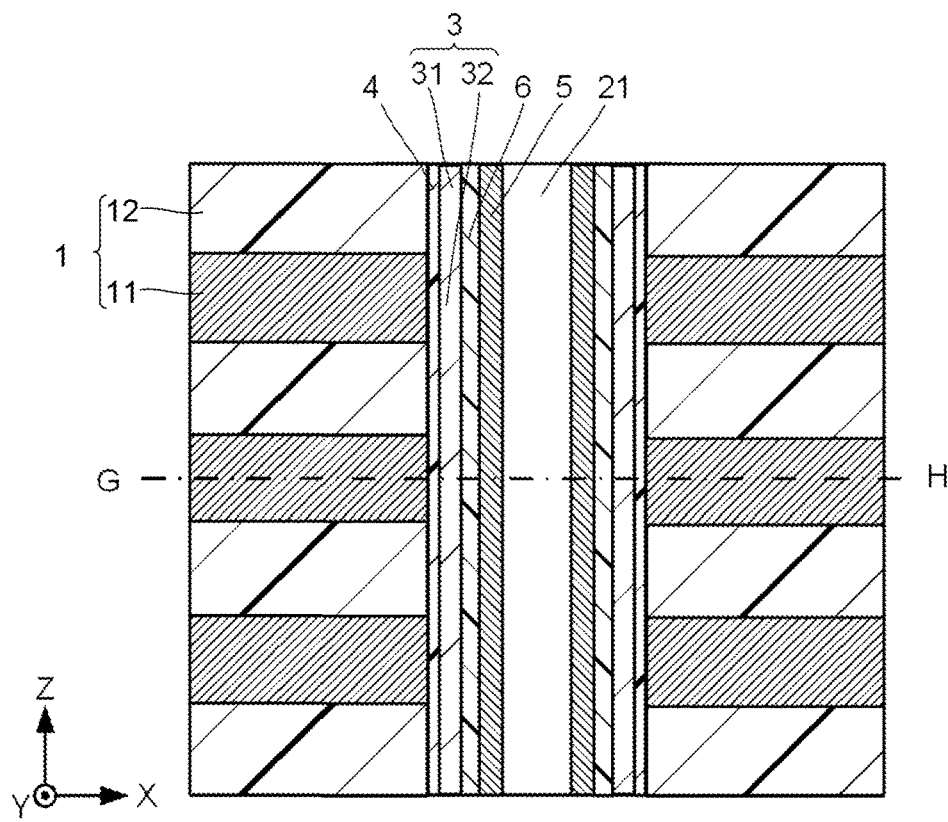
FIG. 46 is a schematic sectional view illustrating a fourth structure example of the NAND string NS.
Figure 47:
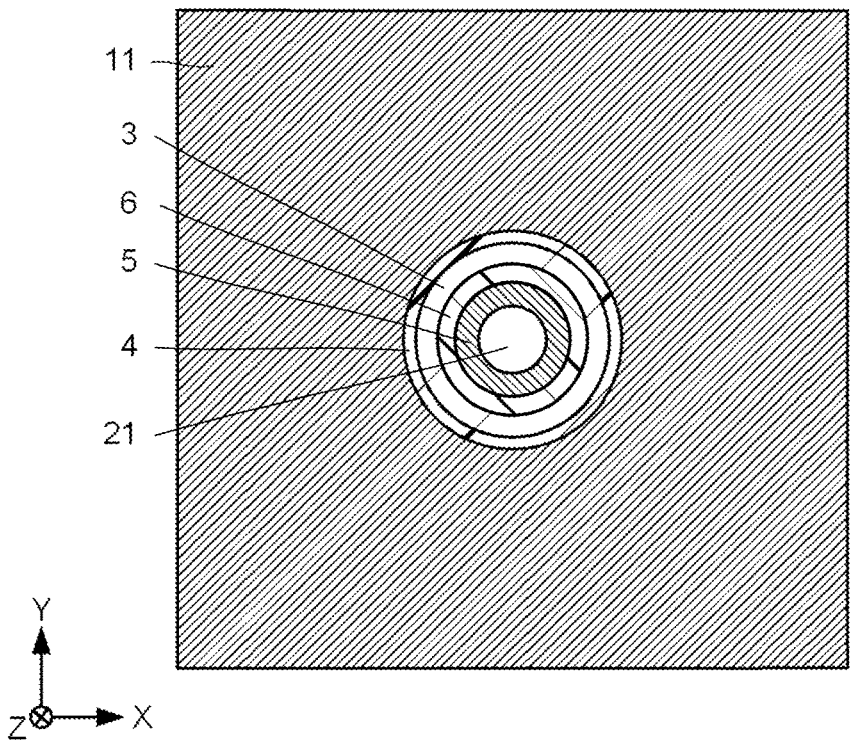
FIG. 47 is a schematic sectional view along a line G-H in FIG. 46.

FIG. 46 is a schematic sectional view for explaining the fourth structure example of the NAND string NS, and illustrates a part of X-Z cross section. FIG. 47 is a schematic sectional view along a line G-H in FIG. 46, and illustrates a part of X-Y cross section.

As illustrated in FIG. 46 and FIG. 47, the NAND string NS includes a stack 1, an insulation layer 21, a semiconductor layer 3, an insulation layer 4, a memory layer 5, and an intermediate layer (intermediate region) 6.

The stack 1 includes a plurality of wiring layers 11 and a plurality of insulation layers 12. Each of the wiring layers 11 and each of the insulation layers 12 are alternately stacked along the Z axis direction. The wiring layer 11 forms a word line WL and a gate electrode of the switch transistor SW, and extends along the X axis direction. Examples of the wiring layer 11 include a conductive layer such as a tungsten layer. Examples of the insulation layer 12 include a silicon oxide layer.

The insulation layer 21 is provided along a direction (Z axis direction) in which the wiring layer 11 and the insulation layer 12 are stacked, for example. The insulation layer 21 can function as a core insulator. The insulation layer 21 has a columnar shape, for example. Examples of the insulation layer 21 include a silicon oxide layer.

As illustrated in FIG. 47, the semiconductor layer 3 surrounds the insulation layer 21 in the X-Y cross section. The semiconductor layer 3 includes a region 31 which is provided between the insulation layer 12 and the insulation layer 21 and overlaps with the insulation layer 12 in the X axis direction, and a region 32 which is provided between the wiring layer 11 and the insulation layer 21 and overlaps with the wiring layer 11 in the X axis direction.

The region 31 and the region 32 contain polysilicon, for example. An electric resistivity of the region 31 is preferably lower than an electric resistivity of the region 32. The region 31 may also contain the impurity-doped silicon to lower the electric resistivity of the region 31.

The insulation layer 4 is provided between the wiring layer 11 and the region 32 and between the insulation layer 12 and the region 31. The insulation layer 4 forms a gate insulation layer of the switch transistor SW. Examples of the insulation layer 4 include a silicon oxide layer.

The memory layer 5 is provided on the opposite side of the region 31 from the insulation layer 12, and on the opposite side of the region 32 from the wiring layer 11. The memory layer 5 extends between the insulation layer 21 and the region 31 and between the insulation layer 21 and the region 32. The memory layer 5 forms the variable resistor R. The memory layer 5 includes, for example, the resistance-change layer or the capacitance-change layer.

The intermediate layer 6 extends between the region 31 and the region 32, and the memory layer 5. The intermediate layer 6 includes a current confinement part, for example. Examples of the current confinement part include a pinhole, and a conductive path. Examples of the intermediate layer 6 include a dielectric film. The intermediate layer 6 is made of an insulation material or a semiconductor material, for example. The intermediate layer 6 is preferably thinner than the semiconductor layer 3 or the memory layer 5. The thickness of the intermediate layer 6 is not limited, but is 1 nm or more and 3 nm or less, for example.

Next, an example of a method of manufacturing the NAND string NS will be described. FIG. 48 to FIG. 51 are schematic sectional views for explaining the example of the method of manufacturing the NAND string NS illustrated in FIG. 46, and each of which illustrates a part of X-Z cross section.

First, similarly to FIG. 5 and FIG. 6, the stack 1a and the memory hole MH are formed. The method of forming these is the same as that of the first structure example, so that explanation thereof will be omitted in this example.

Figure 48:
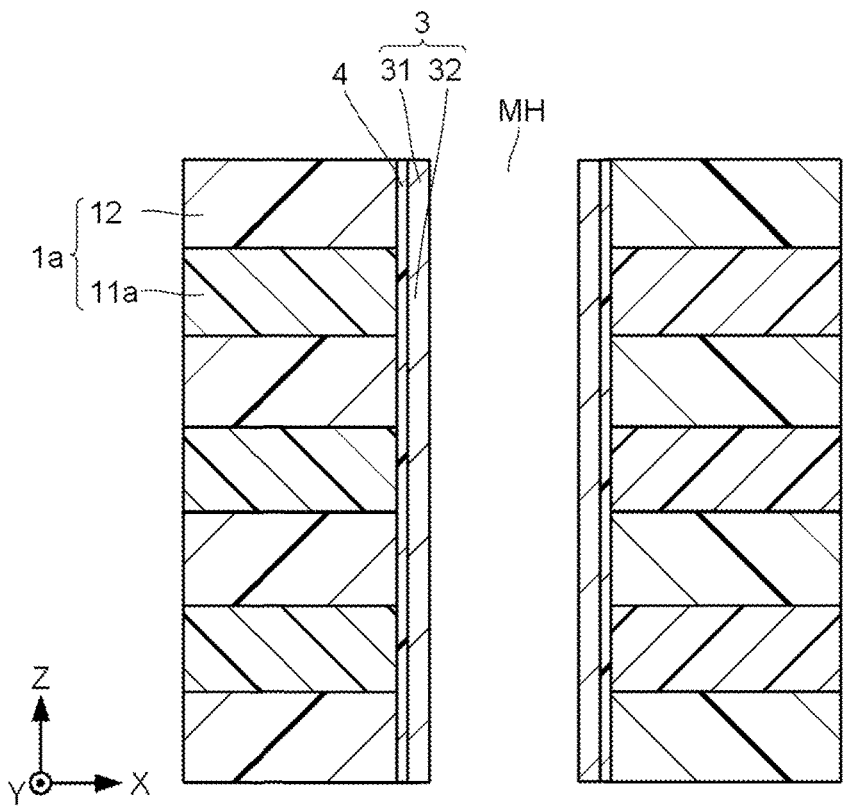
FIG. 48 is a schematic sectional view for explaining an example of a method of manufacturing the NAND string NS illustrated in FIG. 46.

Next, as illustrated in FIG. 48, the insulation layer 4 and the semiconductor layer 3 are formed in order on a face facing the memory hole MH of the insulation layer 11a and on a face facing the memory hole MH of the insulation layer 12. The method of forming these is the same as that of the first structure example, so that explanation thereof will be omitted in this example.

Figure 49:
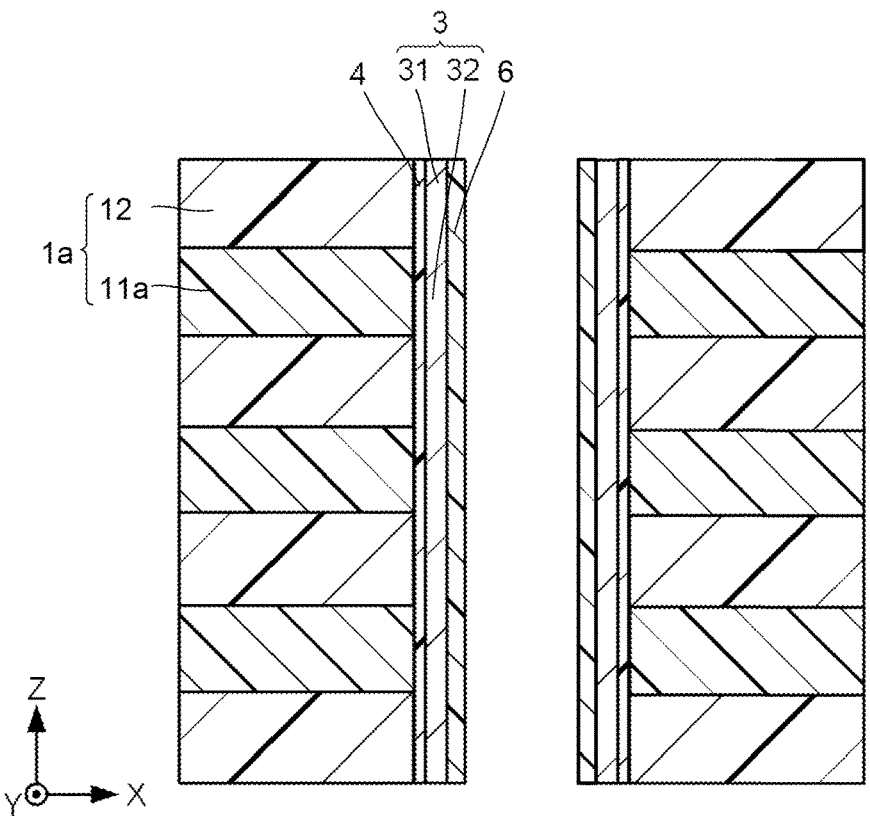
FIG. 49 is a schematic sectional view for explaining the example of the method of manufacturing the NAND string NS illustrated in FIG. 46.

Next, as illustrated in FIG. 49, the intermediate layer 6 is formed on a surface of the semiconductor layer 3. The intermediate layer 6 can be formed by the CVD method or the ALD method, for example.

Figure 50:
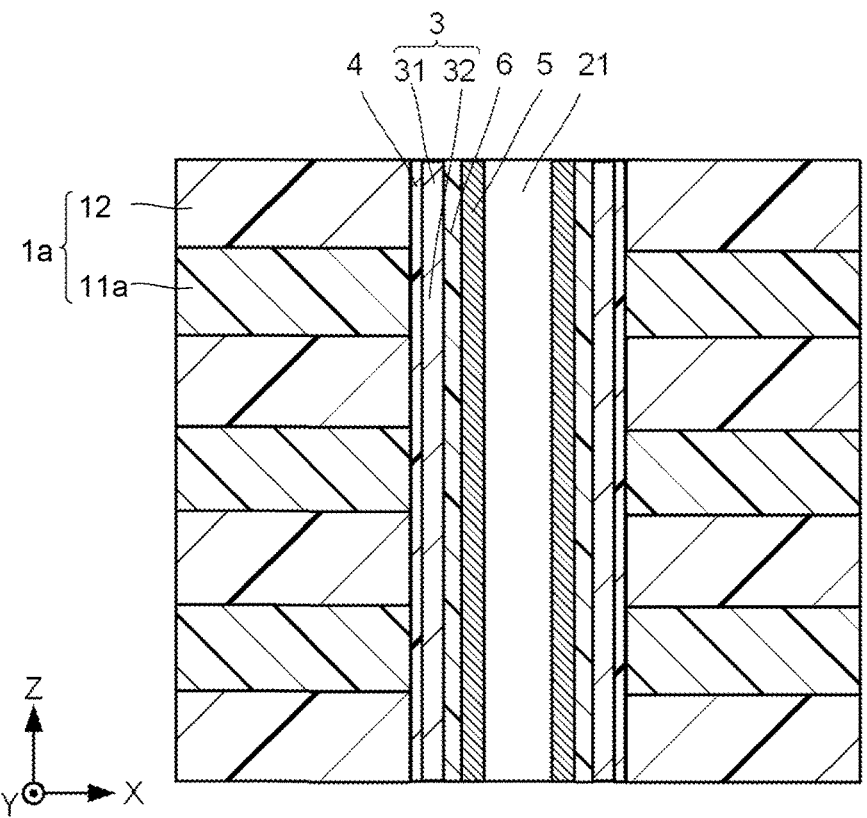
FIG. 50 is a schematic sectional view for explaining the example of the method of manufacturing the NAND string NS illustrated in FIG. 46.

Next, as illustrated in FIG. 50, the memory layer 5 is formed on a surface of the intermediate layer 6, and then the insulation layer 21 filling the memory hole MH is formed. The method of forming these is the same as that of the first structure example, so that explanation thereof will be omitted in this example.

Figure 51:
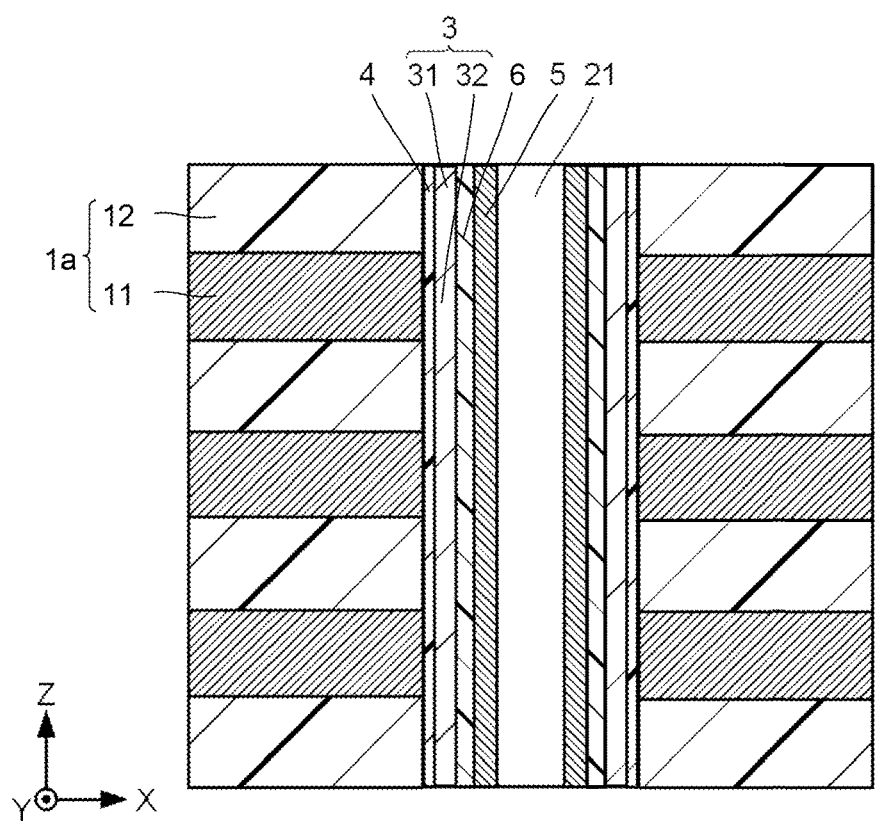
FIG. 51 is a schematic sectional view for explaining the example of the method of manufacturing the NAND string NS illustrated in FIG. 46.

Next, as illustrated in FIG. 51, the insulation layer 11a is removed and thus a cavity is formed, and then the wiring layer 11 is formed in the cavity. The method of forming these is the same as that of the first structure example, so that explanation thereof will be omitted in this example. The above-described process can form the memory cells including the switch transistors SW and the variable resistors R.

In the fourth structure example, the intermediate layer 6 is provided between the semiconductor layer 3 and the memory layer 5. The intermediate layer 6 can be used for increasing a current density when a current is supplied to the memory layer 5 to change an electric resistance or an electric capacitance. A decrease of the current density may cause malfunctions of the memory cell.

Figure 52:
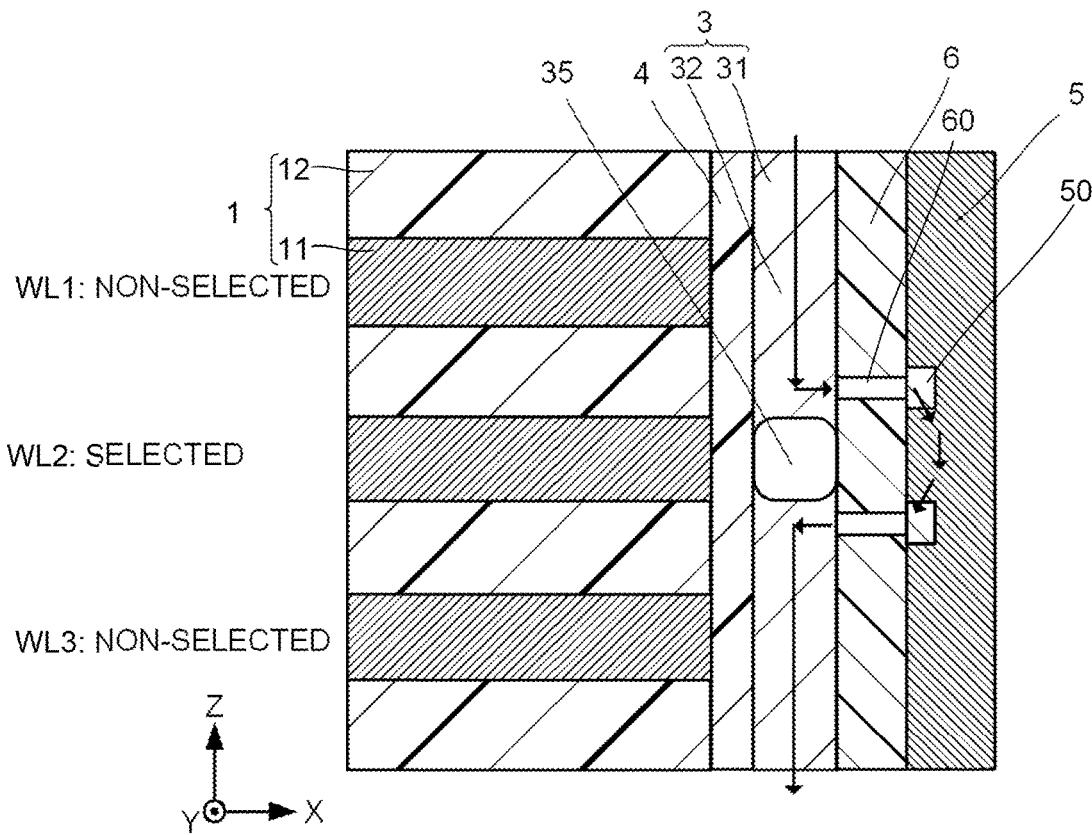
FIG. 52 is a schematic view for explaining an operation example of the memory cell in the fourth structure example.

FIG. 52 is a schematic view for explaining an operation example of the memory cell in the fourth structure example. FIG. 52 illustrates a word line WL1, a word line WL2, a word line WL3, and memory cells connected to these word lines WL.

When the memory cell corresponding to the word line WL2 is selected when performing writing, and the memory cells corresponding to the word line WL1 and the word line WL3, respectively, are not selected, the switch transistors SW connected to the word lines WL1, WL3 corresponding to the non-selected memory cells are turned into an on-state, resulting in that a current flows between the source and the drain. In contrast, control of the switch transistor SW connected to the word line WL2 corresponding to the selected memory cell into an off-state, enables to form a depletion layer 35.

The current that flows through the switch transistor SW connected to the word line WL1 is supplied to the memory layer 5 via the current confinement part 60 of the intermediate layer 6. This can increase a current density of the current supplied to the memory layer 5. In this case, a part of the memory layer 5 is heated to a temperature of 600° C. or more, for example, to change an electric resistance or an electric capacitance at the part to form a region 50. The region 50 is preferably formed in at least one selected from the group consisting of the vicinity of the current confinement part 60 on the current-inflow side of the memory layer 5 or the vicinity of the current confinement part 60 on the current-outflow side of the memory layer 5. The formation of the region 50 can increase the current density of the current that flows through the memory layer 5. This can prevent the operation failure of the memory cell.

Figure 53:
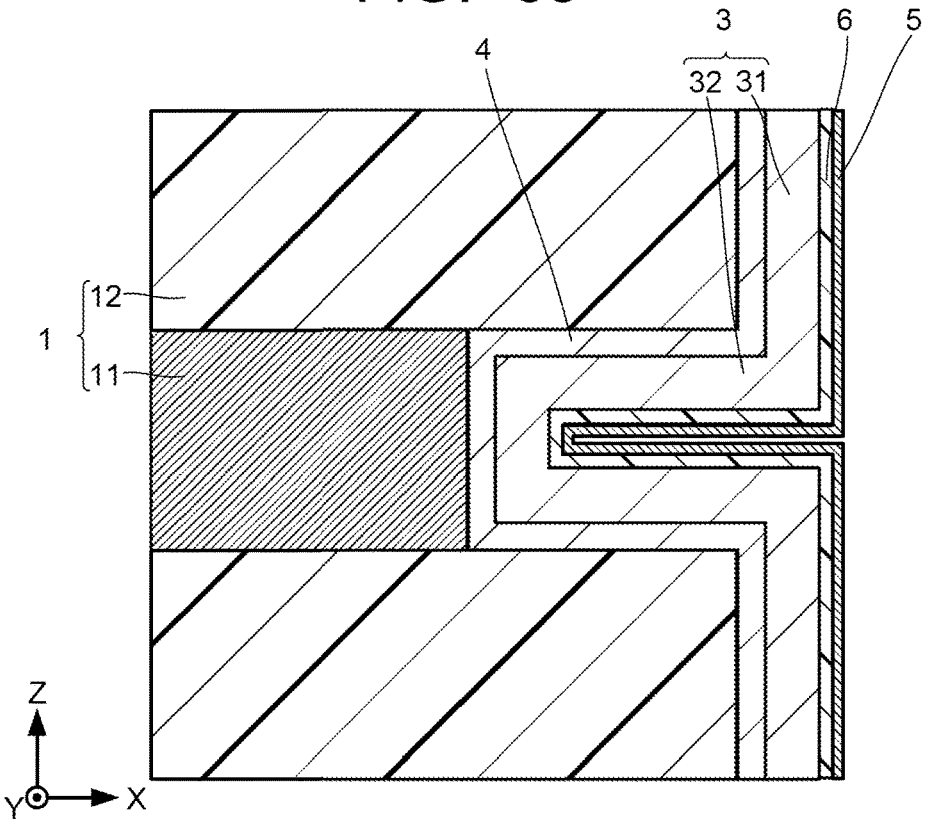
FIG. 53 is a schematic sectional view illustrating another structure example of the memory cell.

The fourth structure example is not limited to the structure illustrated in FIG. 46. FIG. 53 is a schematic sectional view illustrating another structure example of the memory cell, and illustrates the X-Z cross section. Explanation of parts same as those of FIG. 46 will be omitted in this structure example.

FIG. 53 illustrates the semiconductor layer 3 including the region 31 and the region 32, similarly to the first structure example, in which the region 32 includes a part (protrusion) provided between the insulation layers 12 in the Z axis direction and protruding further toward the wiring layer 11 than the region 31 in the X axis direction. In this example, the memory layer 5 and the intermediate layer 6 also protrude toward the wiring layer 11 with the region 32. This can increase an effective distance between memory cells to prevent heat conduction between adjacent memory cells and thus prevent malfunctions such as erroneous writing. The other explanation is the same as that of the first structure example, so that explanation will be omitted in this structure example.

The configurations of the fourth structure example can be appropriately combined with the configurations of the first structure example, the configurations of the second structure example, and the configurations of the third structure example.

While certain embodiments of the present invention have been described above, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
   a stack including a wiring layer and an insulation layer, the wiring layer and the insulation layer being alternately stacked in a first direction;
   a semiconductor layer including a first region and a second region, the first region overlapping with the insulation layer in a second direction intersecting the first direction, and the second region overlapping with the wiring layer in the second direction;
   an insulation region provided between the wiring layer and the second region; and
   a memory region overlapping with the wiring layer in the second direction, wherein:
   the wiring layer is farther from the first region in the second direction than the insulation layer is;
   the second region has a part provided between a plurality of the insulation layers in the first direction and protruding further toward the wiring layer than the first region in the second direction;
   the part of the second region includes a first portion between the memory region and the wiring layer in the second direction; and
   the memory region has a face opposite to the first portion, the face being closer to the wiring layer in the second direction than the first region is.
2. The device according to claim 1, further comprising a second insulation layer on the face, wherein
   the memory region is provided between the first portion of the part of the second region and the second insulation layer in the second direction.
3. The device according to claim 2, wherein
   the part of the second region includes a second portion and a third portion, each of the second portion and the third portion extending along the insulation layers; and
   at least a part of the second insulation layer is provided between the second portion and the third portion in the first direction.
4. The device according to claim 1, wherein
   the first region contains silicide or impurity-doped silicon.
5. The device according to claim 1, wherein
   the memory region includes a variable resistance layer or a variable capacitance layer.
6. The device according to claim 1, wherein:
   the second region has a first surface and a second surface;
   the insulation region is provided on the first surface; and
   the memory region is provided on the second surface.
7. The device according to claim 1, wherein
   the memory region does not extend between the insulation layer and the first region in the second direction.

8. The device according to claim 1, wherein
the insulation region further extends between the insulation layer and the second region in the first direction, and
the memory region overlaps with the insulation region in the first direction.

9. The device according to claim 1, wherein
the part of the second region includes a second portion and a third portion, each of the second portion and the third portion extending along the insulation layers, and
the memory region is provided between the second portion and the third portion in the first direction.

\* \* \* \* \*